United States Patent
Aikawa

(10) Patent No.: US 12,020,737 B2
(45) Date of Patent: Jun. 25, 2024

(54) MEMORY DEVICE, MEMORY SYSTEM, AND METHOD OF MANUFACTURING MEMORY DEVICE

(71) Applicant: Kioxia Corporation, Tokyo (JP)

(72) Inventor: Hisanori Aikawa, Seoul (KR)

(73) Assignee: Kioxia Corporation, Tokyo (JP)

( * ) Notice: Subject to any disclaimer, the term of this patent is extended or adjusted under 35 U.S.C. 154(b) by 358 days.

(21) Appl. No.: 17/464,808

(22) Filed: Sep. 2, 2021

(65) Prior Publication Data

US 2022/0284938 A1 Sep. 8, 2022

(30) Foreign Application Priority Data

Mar. 2, 2021 (JP) ................. 2021-032332

(51) Int. Cl.
| | | |
|---|---|---|
| *G11C 11/00* | (2006.01) | |
| *G11C 11/16* | (2006.01) | |
| *H10B 61/00* | (2023.01) | |
| *H10N 50/01* | (2023.01) | |
| *H10N 50/10* | (2023.01) | |
| *H10N 50/85* | (2023.01) | |

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H10B 61/10* (2023.02); *H10N 50/01* (2023.02); *H10N 50/10* (2023.02); *H10N 50/85* (2023.02)

(58) Field of Classification Search
CPC .............. G11C 11/161; G11C 11/1655; G11C 11/1657; G11C 11/1673; G11C 11/1675
See application file for complete search history.

(56) References Cited

U.S. PATENT DOCUMENTS

| | | | | | |
|---|---|---|---|---|---|
| 4,875,196 | A | * | 10/1989 | Spaderna | ................. G11C 8/16 365/189.04 |
| 5,590,087 | A | * | 12/1996 | Chung | .................... G11C 8/16 365/49.1 |
| 6,556,502 | B2 | * | 4/2003 | Ngai | .................... G11C 7/1075 365/230.03 |
| 2019/0019553 | A1 | | 1/2019 | Derner et al. | |
| 2019/0108880 | A1 | | 4/2019 | Park et al. | |
| 2019/0362791 | A1 | | 11/2019 | Kim et al. | |

FOREIGN PATENT DOCUMENTS

JP         2000315384 A     11/2000

* cited by examiner

*Primary Examiner* — Pho M Luu
(74) *Attorney, Agent, or Firm* — Holtz, Holtz & Volek PC

(57) ABSTRACT

A memory device includes a memory cell array, first and second memory cells, first and second read circuits, and first and second write circuits. The memory cell array includes first and second sub-arrays. The first memory cells are included in each of the first sub-arrays. The second memory cells are included in each of the second sub-arrays. The first and second read circuits are provided for reading data of the first and second memory cells, respectively. The first and second write circuits are provided for writing data to the first and second memory cells, respectively. An area of the first sub-array is different from an area of the second sub-array.

19 Claims, 18 Drawing Sheets

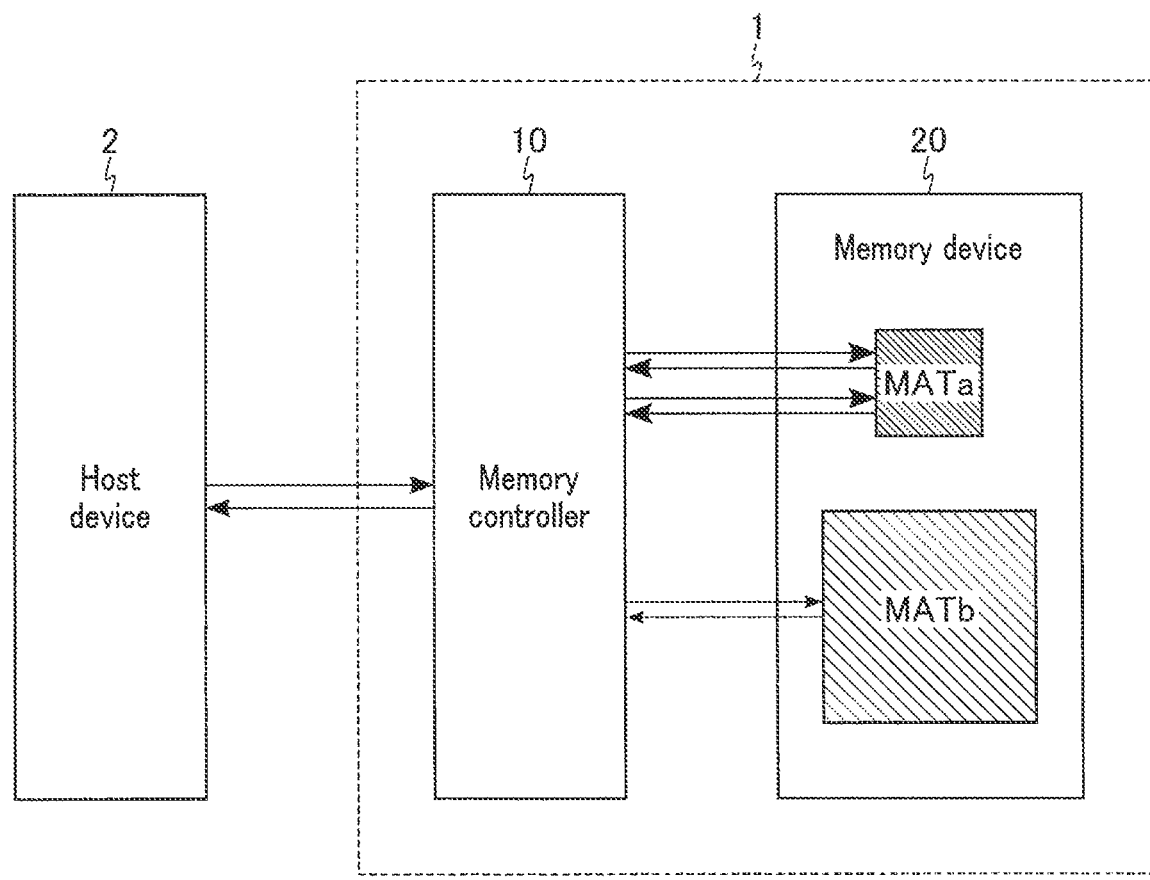
F I G. 21

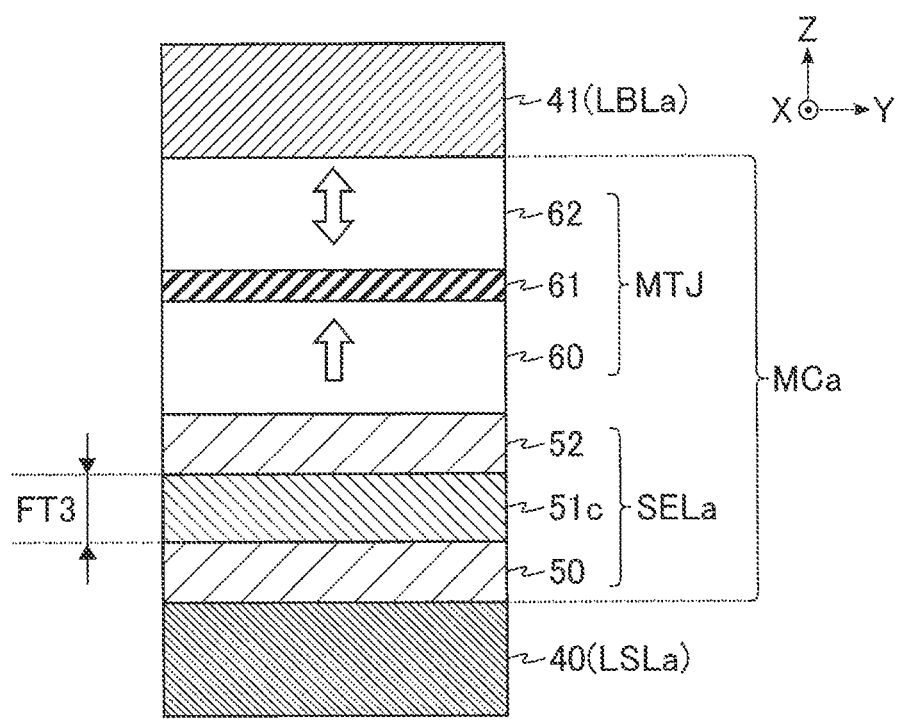
F I G. 22

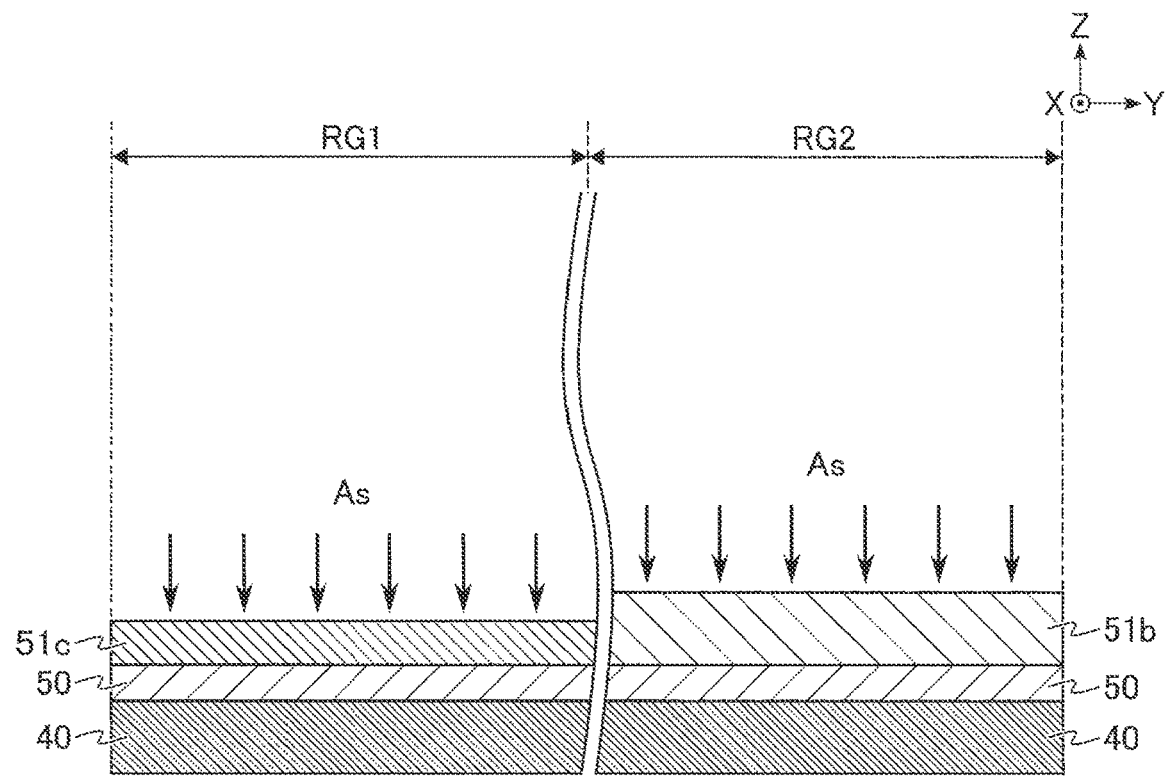
F I G. 26
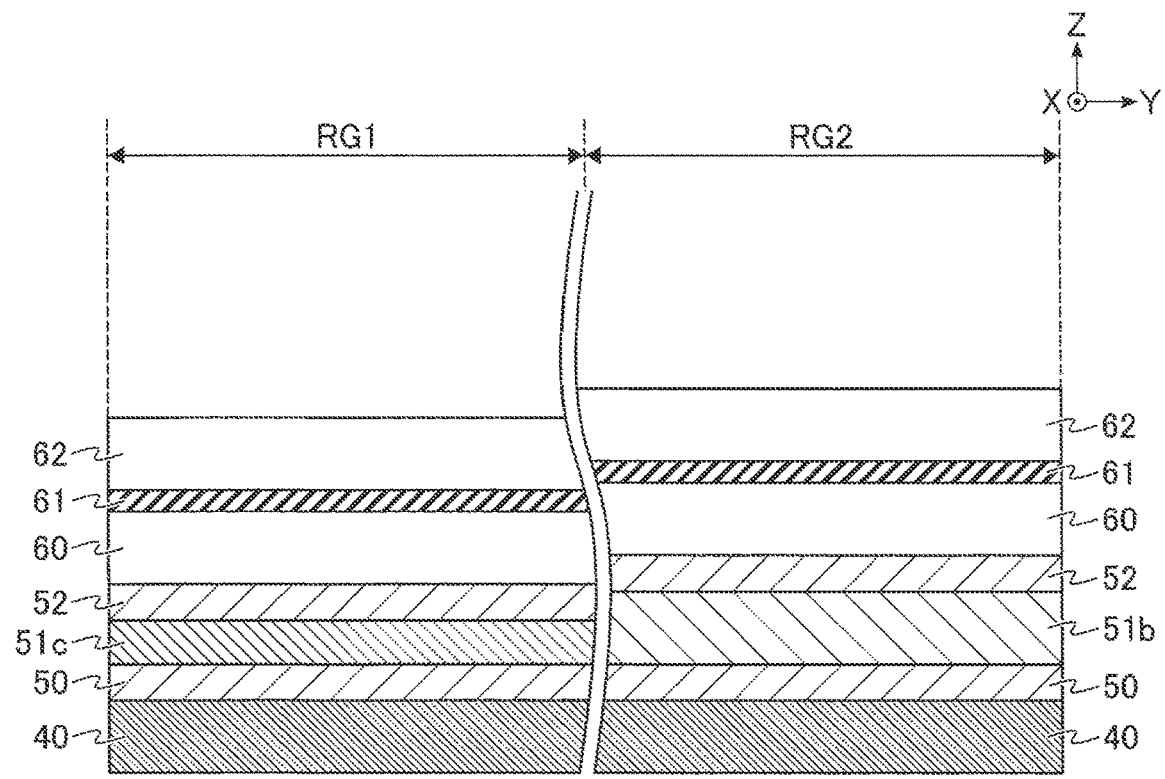
F I G. 27

MEMORY DEVICE, MEMORY SYSTEM, AND METHOD OF MANUFACTURING MEMORY DEVICE

CROSS-REFERENCE TO RELATED APPLICATIONS

This application is based upon and claims the benefit of priority from Japanese Patent Application No. 2021-032332, filed Mar. 2, 2021, the entire contents of which are incorporated herein by reference.

FIELD

Embodiments described herein relate generally to a memory device, a memory system, and a method of manufacturing the memory device.

BACKGROUND

A memory device (magnetoresistive random access memory (MRAM)) which adopts a magnetoresistance effect element as a memory element is known.

BRIEF DESCRIPTION OF THE DRAWINGS

FIG. 21 is a schematic diagram showing an example of a method of using the memory system according to the first embodiment.

FIG. 22 is a cross-sectional view showing an example of a cross-sectional structure of a first memory cell of a memory device according to a second embodiment.

FIGS. 24, 25, 26, 27, and 28 are cross-sectional views showing at example of a cross-sectional structure of the memory device according to the second embodiment during manufacture of the memory device.

DETAILED DESCRIPTION

Figure 1:
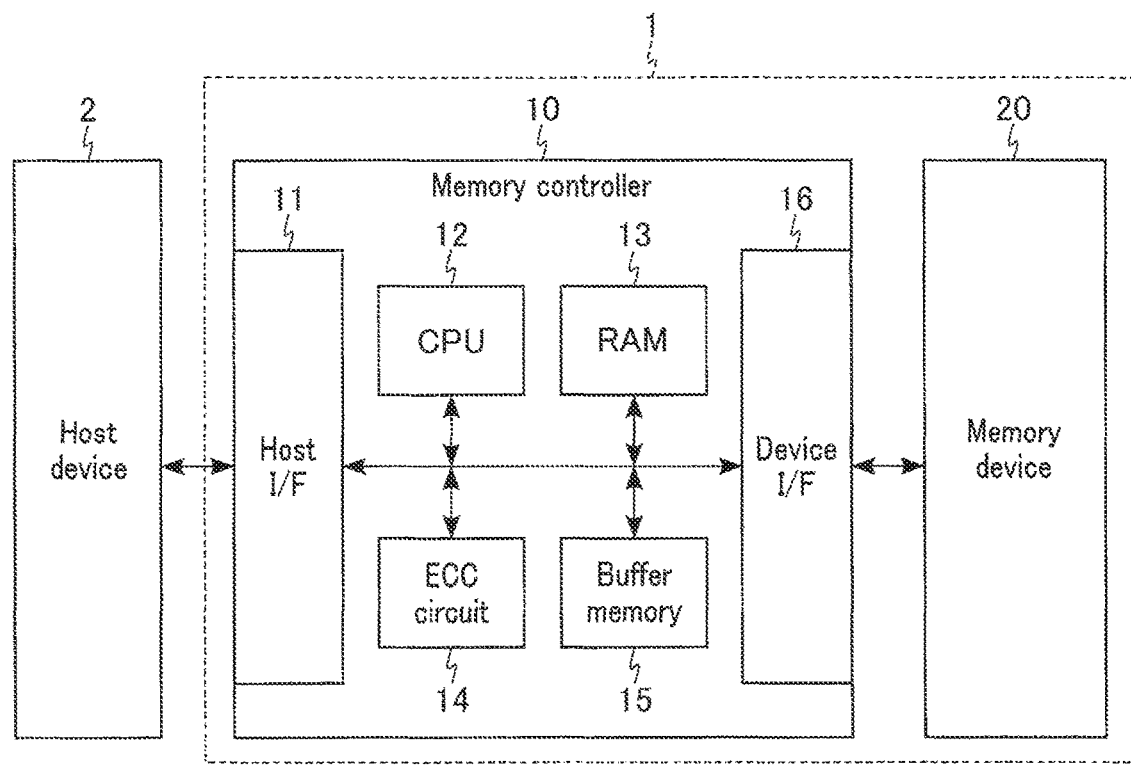
FIG. 1 is a block diagram showing a configuration example of a memory system according to a first embodiment.

In general, according to one embodiment, a memory device according to an embodiment includes a memory cell array, first memory cells, second memory cells, a first read circuit, a second read circuit, a first write circuit, and a second write circuit. The memory cell array includes first sub-arrays and second sub-arrays. The first memory cells is included in each of the first sub-arrays. The second memory cells is included in each of the second sub-arrays. The first read circuit is provided for reading data of the first memory cells. The second read circuit is provided for reading data of the second memory cells. The second read circuit differs from the first read circuit. The first write circuit is provided for writing data to the first memory cells. The second write circuit is provided for writing data to the second memory cells. The second write circuit differs from the first write circuit. An area of the first sub-array is different from an area of the second sub-array.

Hereinafter, the embodiment will be described with reference to the accompanying drawings. The drawings are schematic or conceptual. The dimensions, ratios, and the like in the drawings do not always correspond to the actual ones. In the descriptions below, constituent elements having substantially the same function and configuration will be denoted by the same reference symbol. A numeral, etc., following letters constituting a reference symbol is used to distinguish between elements with the same configuration and are referred to by reference symbols including the same letters. When elements represented by reference symbols that include the same letters need not be distinguished from one another, they are referred to by reference symbols that include only letters. When elements represented by reference symbols including the same letters or numerals are different from one another, the difference between them will be described.

First Embodiment

A memory system 1 according to a first embodiment will be described below.

[1-1] Configuration

[1-1-1] Overall Configuration of Memory System 1

FIG. 1 is a block diagram showing a configuration example of the memory system 1 according to the first embodiment. As shown in FIG. 1, the memory system 1 is configured to be coupled to an external host device 2, and includes, for example, a memory controller 10 and a memory device 20.

The memory controller 10 is configured to be able to control the memory device 20. The memory controller 10 may order the memory device 20 to perform a read operation, a write operation, etc., in response to a request (order) from the host device 2. The memory controller 10 manages a storage space of the memory device 20.

The memory device 20 includes memory cells and non-volatilely stores data. The memory device 20 uses a variable resistance element for storing data. For example, an element (MTJ element) having a magnetoresistance effect provided by a magnetic tunnel junction (MTJ) is used as a variable resistance element. The MTJ element is also referred to as a "magnetoresistance effect element". The memory device 20 which adopts the MTJ element may also be referred to as a "magnetic memory device".

[1-1-2] Configuration of Memory Controller 10

FIG. 1 also shows a detailed configuration of the memory controller 10. As shown in FIG. 1, the memory controller 10 includes, for example, a host interface (I/F) 11, a central processing unit (CPU) 12, a random access memory (RAM) 13, an error correcting code (ECC) circuit 14, a buffer memory 15, and a device interface (I/F) 16.

The host interface 11 is coupled to the host device 2, and controls communications between the memory controller 10 and the host device 2. The host interface 11 transfers a request and data received from the host device 2 to the CPU 12 and the buffer memory 15, respectively. In response to an order from the CPU 12, the host interface 11 transfers data in the buffer memory 15 to the host device 2.

The CPU 12 controls the operation of the entire memory controller 10. For example, the CPU 12 issues a write order including a command, an address, etc., in response to a write request received from the host device 2. The write order issued is transferred to the memory device 20, and the memory device 20 performs a write operation based on the write order. The CPU 12 may also perform a read operation in a manner similar to the write operation.

The RAM 13 is used as a working region of the CPU 12. The RAM 13 holds firmware for managing the memory device 20, various management tables, and the like. For example, a semiconductor memory such as a static random access memory (SRAM) or a dynamic random access memory (DRAM) is used as the RAM 13.

The ECC circuit 14 performs processing related to error correction of data. At the time of the write operation, the ECC circuit 14 generates parity based on the write data received from the host device 2 and adds the generated parity to the write data. At the time of the read operation, the ECC circuit 14 generates a syndrome based on the read data received from the memory device 20, and detects and corrects errors in the read data based on the generated syndrome.

The buffer memory 15 temporarily holds the read data received by the memory controller 10 from the memory device 20, and the write data received by the memory controller 10 from the host device 2. As the buffer memory 15, a volatile memory or a nonvolatile semiconductor memory may be used. Also, the buffer memory 15 may be externally coupled to the memory controller 10 or integrated into the RAM 13.

The device interface 16 is coupled to the memory device 20, and controls communications between the memory controller 10 and the memory device 20. The device interface 16 transfers an order issued from the CPU 12 to the memory device 20. At the time of the write operation, the device interface 16 transfers the write data held in the buffer memory 15 to the memory device 20. At the time of the read operation, the device interface 16 transfers the read data received from the memory device 20 to the buffer memory 15.

[1-1-3] Configuration of Memory Device 20

Figure 2:
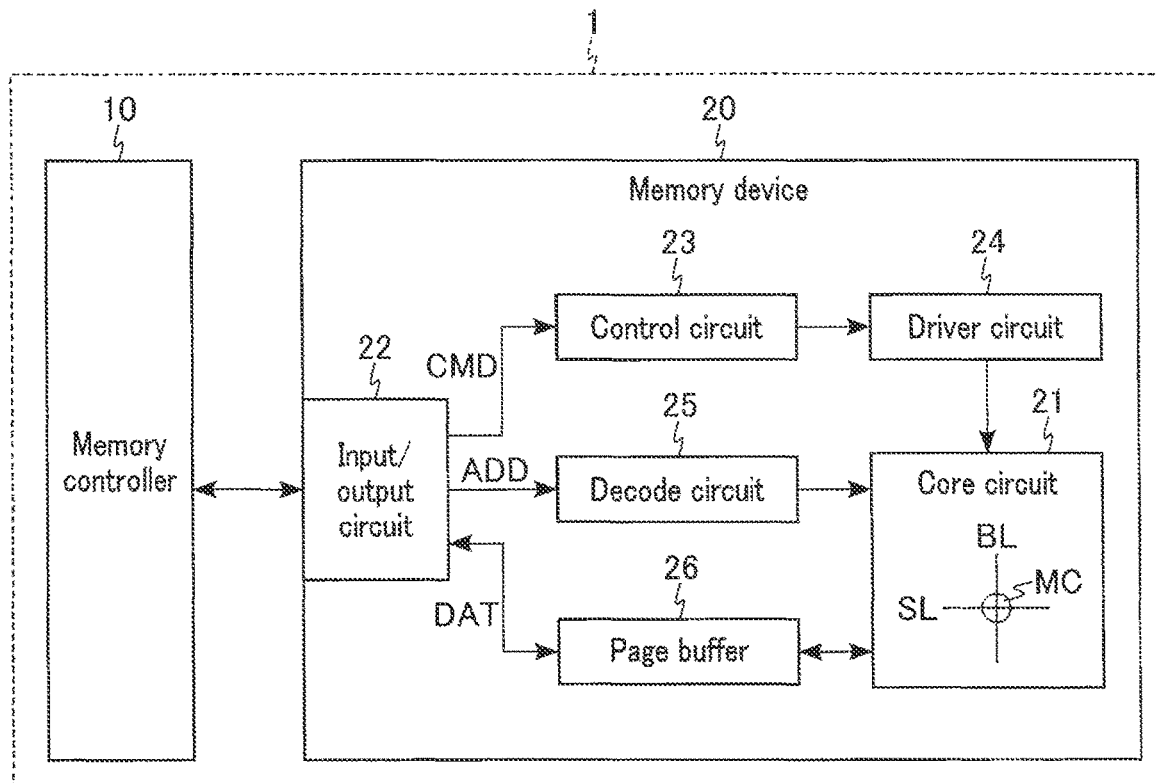
FIG. 2 is a block diagram showing a configuration example of the memory system according to the first embodiment.

FIG. 2 is a block diagram showing a configuration example of the memory system 1 according to the first embodiment, and a detailed configuration of the memory device 20. As shown in FIG. 1, the memory device 20 includes, for example, a core circuit 21, an input/output circuit 22, a control circuit 23, a driver circuit 24, a decode circuit 25, and a page buffer 26.

The core circuit 21 is provided with memory cells MC used to store data and a peripheral circuit for accessing each memory cell MC. Each memory cell MC is coupled between a single source line SL and a single bit line BL, and associated with a set including a row and a column. A row address is allocated to the source line SL, and a column address is allocated to the bit line BL. Details of the core circuit 21 will be described later.

The input/output circuit 22 is coupled to the memory controller 10, and controls communications between the memory device 20 and the memory controller 10. The input/output circuit 22 transfers a command CMD, an address ADD, and data DAT received from the memory controller 10 to the control circuit 23, decode circuit 25, and page buffer 26, respectively. The input/output circuit 22 also transfers the data DAT received from the page buffer 26 to the memory controller 10.

The control circuit 23 controls the operation of the entire memory device 20. Specifically, the control circuit 23 may control the input/output circuit 22, core circuit 21, driver circuit 24, decode circuit 25, and page buffer 26. The control circuit 23 may then perform a write operation, a read operation, etc., in accordance with the command CMD transferred from the input/output circuit 22.

The driver circuit 24 generates voltages used in the read operation, write operation, etc., and transfers the generated voltages to the peripheral circuit in the core circuit 21. For example, when the control circuit 23 receives the command CMD associated with the write operation, the driver circuit 24 generates a voltage used in the write operation based on an instruction from the control circuit 23.

The decode circuit 25 decodes the address ADD transferred from the input/output circuit 22. The address ADD contains a set including a row address and a column address that designate a memory cell MC as an operation target. Then, the decode circuit 25 controls the peripheral circuit in the core circuit 21 based on the decoding result of the address ADD.

The page buffer 26 includes latch circuits. The latch circuits may hold write data, read data, etc. At the time of the write operation, the page buffer 26 temporarily holds the write data received from the input/output circuit 22 and transfers the data to the core circuit 21. At the time of the read operation, the page buffer 26 temporarily holds the read data received from the core circuit 21 and transfers the data to the input/output circuit 22.

[1-1-4] Configuration of Core Circuit 21

Figure 3:
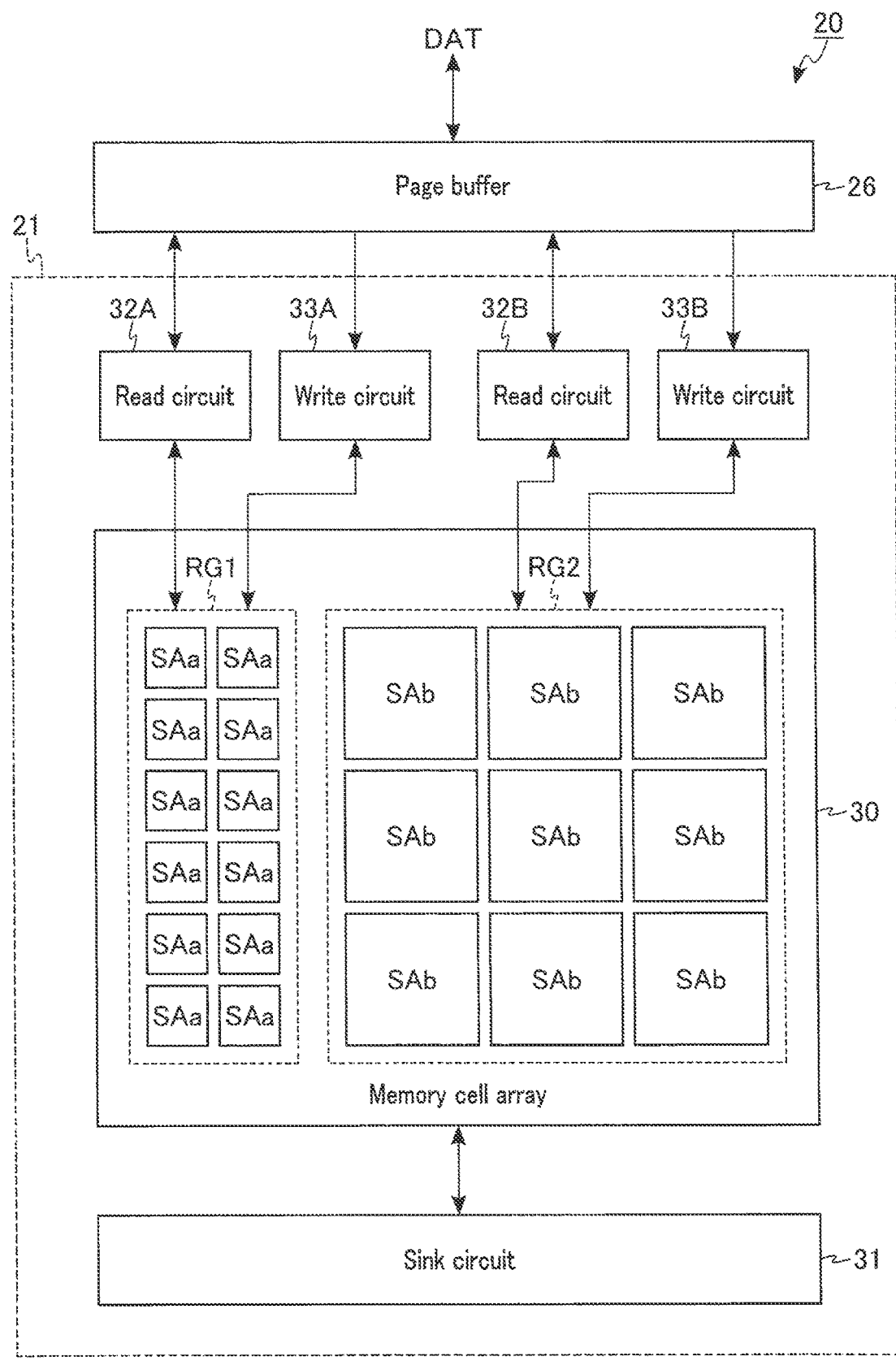
FIG. 3 is a circuit diagram showing a configuration example of a core circuit of the memory device according to the first embodiment.

FIG. 3 is a circuit diagram showing a configuration example of the core circuit 21 of the memory device 20 according to the first embodiment, and also shows the page buffer 26. As shown in FIG. 3, the core circuit 21 includes, for example, a memory cell array 30, a sink circuit 31, read circuits 32A and 32B, and write circuits 33A and 33B.

The memory cell array 30 includes a first storage region RG1 and a second storage region RG2. The first storage region RG1 includes sub-arrays SAa. The second storage region RG2 includes sub-arrays SAb. Each of the sub-arrays SAa and SAb include memory cells MC. The area of a single sub-array SAa is smaller than that of a single sub-array SAb. The sub-arrays SAa and the sub-arrays SAb are formed on the same substrate, and the total area of the sub-arrays SAb is larger than that of the sub-arrays SAa. Both the number of sub-arrays SAa included in the first storage region RG1 and the number of sub-arrays SAb included in the second storage region RG2 may be any number. The shapes of the first storage region RG1 and the second storage region RG2 are not limited to a rectangular shape and may be set appropriately.

The sink circuit 31 is coupled to a local source line LSL via a global source line GSL provided to the memory cell array 30. The sink circuit 31 can ground the local source line LSL based on the control by the control circuit 23. Details of the global source line GSL and the local source line LSL will be described later.

The read circuit 32 is used to read data stored in the memory cells MC, and includes, for example, a sense amplifier. The read circuit 32 determines the data stored in the memory cells MC by, for example, detecting a current flowing to the memory cells MC. The read circuit 32 then transfers the determination result as read data to the page buffer 26. The read circuits 32A and 32B are associated with the first storage region RG1 and the second storage region RG2, respectively. For example, the read circuits 32A and 32B are optimized for the setting of the read operation on the sub-arrays SAa and SAb, respectively. The memory device 20 may perform the read operation on the sub-arrays SAa and SAb using a single read circuit, provided that optimal setting can be used in the sub-arrays SAa and SAb.

The write circuit 33 is used to write data to the memory cells MC, and includes, for example, a write driver. The write circuit 33 writes desired data to the memory cells MC by, for example, passing a current to the memory cells MC based on the write data transferred from the page buffer 26. The write circuits 33A and 33B are associated with the first storage region RG1 and the second storage region RG2, respectively. For example, the write circuits 33A and 33B are optimized for the setting of the write operation on the sub-arrays SAa and SAb, respectively. The memory device 20 may perform the write operation on the sub-arrays SAa and SAb using a single write circuit, provided that optimal settings can be used in the sub-arrays SAa and SAb.

[1-1-5] Circuit Configuration of Memory Cell Array 30

Regarding the circuit configuration of the memory cell array 30, the elements relayed to the first storage region RG1 and the elements related to the second storage region RG2 will be described in the mentioned order below.

(Circuit Configuration in First Storage Region RG1)

Figure 4:
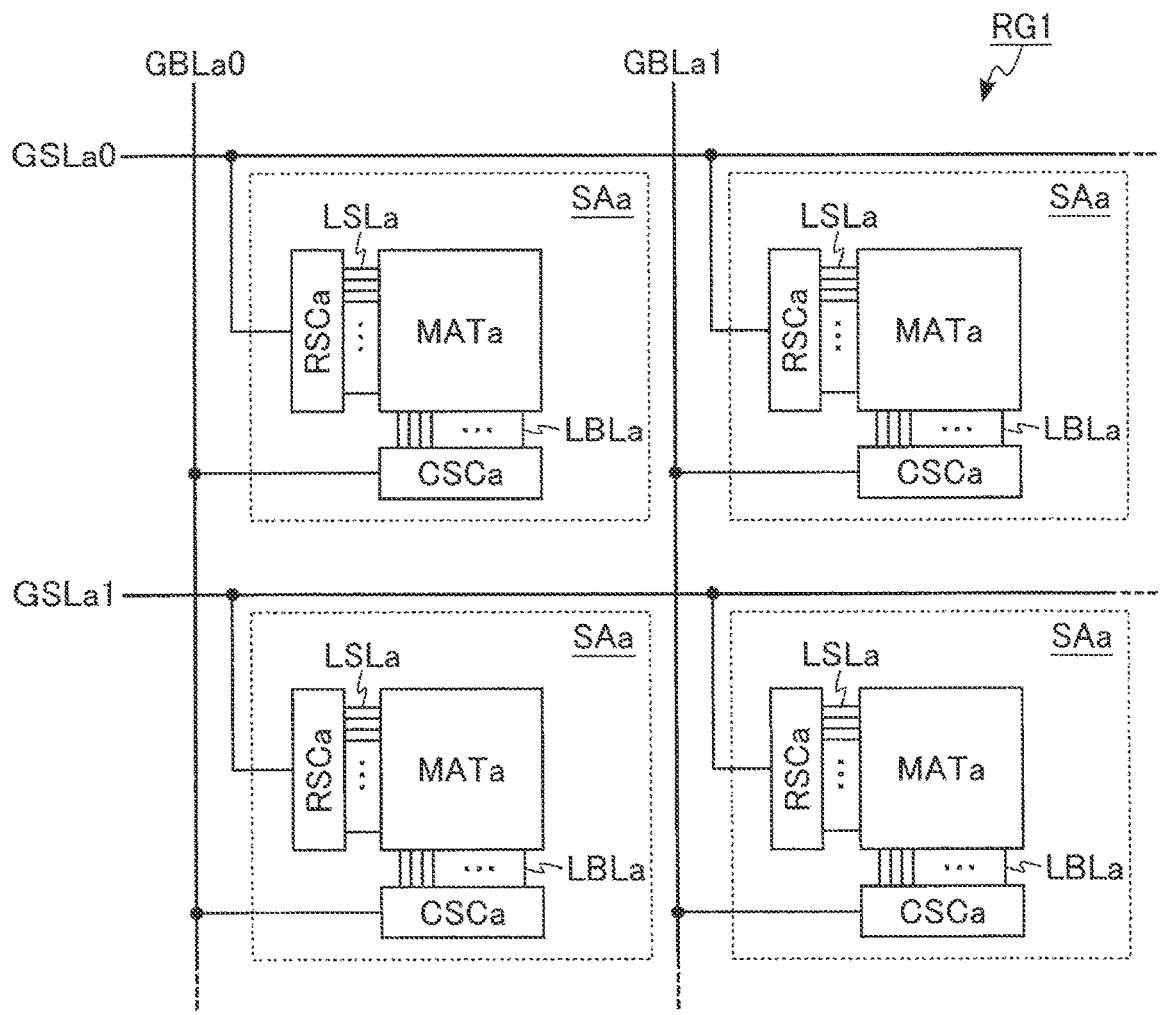
FIG. 4 is a circuit diagram showing a circuit configuration example of sub-arrays included in a first storage region of the core circuit of the memory device according to the first embodiment.

FIG. 4 is a circuit diagram showing a circuit configuration example of the sub-arrays SAa included in the first storage region RG1 of the core circuit 21 of the memory device 20 according to the first embodiment, and also showing interconnects coupled to the sub-arrays SAa. As shown in FIG. 4, the sub-arrays SAa are arranged, for example, in a matrix. The interconnects coupled to the sub-arrays SAa include global source lines GSLa (GSLa0, GSLa1, . . . ) and global bit lines GBLa (GBLa0, GBLs1, . . . ). Each of the sub-arrays SAa include a memory matrix MATa, a row selection circuit RSCa, a column selection circuit CSCa, local source lines LSLa (source lines SL), and local bit lines LBLa (bit lines BL).

The global source lines GSLa and the global bit lines GBLa are configured to be coupled to the sink circuit 31, read circuit 32A, and write circuit 33A, respectively. The sub-arrays SAa are provided in a portion where the global source lines GSLa and the global bit lines GBLa cross each other. Namely, each sub-array SAa is associated with one global source line GSLa and one global bit line GBLa. Focusing on one of the sub-arrays SAa, each configuration included in the sub-array SAa will be described below.

The memory matrix MATa includes first memory cells MCa arranged in a matrix. Each of the first memory cells MCa is coupled between one local source line LSLa and one local bit line LBLa. A set including a row address and a column address is allocated to each of the first memory cells MCa.

The row selection circuit RSCa is coupled to the memory matrix MATa via the local source lines LSLa. The row selection circuit RSCa controls the connection between the global source line GSLa and the local source lines LSLa. The row selection circuit RSCa is supplied with a decoding result (row address) of the address ADD from the decode circuit 25. The row selection circuit RSCa electrically couples one local source line LSLa selected based on the row address and the global source line GSLa associated therewith.

The column selection circuit CSCa is coupled to the memory matrix MATa via the local bit lines LBLa. The column selection circuit CSCa controls the connection between the global bit line GBLa and the local bit lines LBLa. The column selection circuit CSCa is supplied with a decoding result (column address) of the address ADD from the decode circuit 25. The column selection circuit CSCa electrically couples one local bit line LBLa selected based on the column address received from the decode circuit 25 and the global bit line GBLa associated therewith.

(Circuit Configuration of Memory Matrix MATa)

Figure 5:
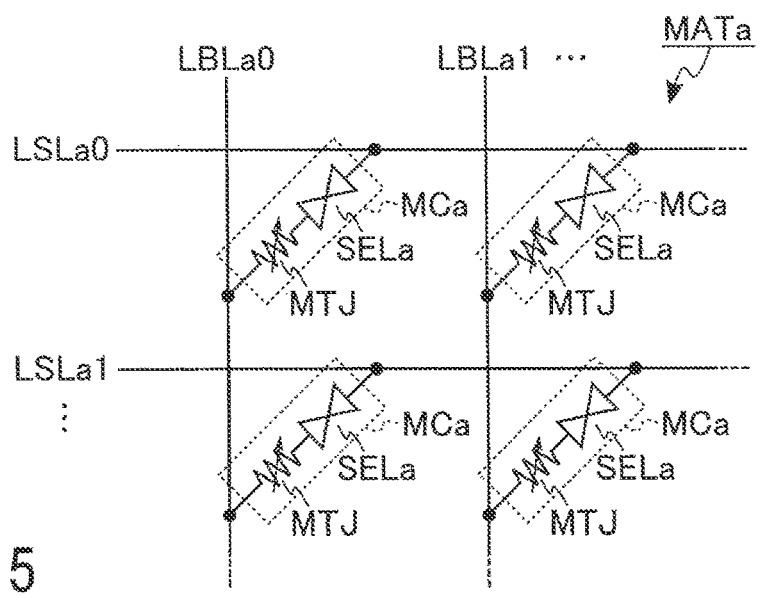
FIG. 5 is a circuit diagram showing a circuit configuration example of a memory matrix included in the first storage region of the core circuit of the memory device according to the first embodiment.

FIG. 5 is a circuit diagram showing a circuit configuration example of the memory matrix MATa included in the first storage region RG1 of the core circuit 21 of the memory device 20 according to the first embodiment. As shown in FIG. 5, the memory cells MCa are coupled between the local source line LSLa0 and the local bit line LBLa0, between the local source line LSLa0 and the local bit line LBLa1, between the local source line LSLa1 and the local bit line LBLa0, and between the local source line LSLa1 and the local bit line LBLa1.

The memory cells MCa arranged in the same row are coupled in common to any one of the local source lines LSLa. The memory cells MCa arranged in the same column are coupled in common to any one of the local bit lines LBLa. Also, each of the first memory cells MCa includes a variable resistance element MTJ and a selector SELa coupled in series. For example, one end of the variable resistance element MTJ is coupled to the local bit line LBLa. The other end of the variable resistance element MTJ is coupled to one end of the selector SELa. The other end of the selector SELa is coupled to the local source line LSLa. The connection relationship between the variable resistance element MTJ and the selector SELa arranged between the local source line LSLa and the local bit line LBLa may be reversed.

The variable resistance element MTJ is, for example, an MTJ element. The variable resistance element MTJ stores data based on the resistance value thereof. For example, the memory cell MC stores "1" data when the variable resistance element MTJ is in a high-resistance state, and stores "0" data when the variable resistance element MTJ is in a low-resistance state. Allocation of the data associated with the resistance value of the variable resistance element MTJ may be set differently. The resistance state of the variable resistance element MTJ may vary depending on the current generated by the write circuit 33A.

The selector SELa is, for example, a bidirectional diode. The selector SELa functions as a switching element which controls supply of a current to the variable resistance element MTJ in each of the write operation and the read operation directed to the variable resistance element MTJ associated therewith. Specifically, the selector SELa included in a memory cell MCa is turned off when the voltage applied to the memory cell MCa is below a threshold voltage Vtha, and turned on when the voltage applied to the memory cell MCa is equal to or greater than the threshold voltage Vtha. In an OFF state, the selector SELa functions as an insulator having a high resistance value. When the selector SELa is in an OFF state, no current flows between the local source line LSLa and the local bit line LBLa coupled to the memory cell MCa. In an ON state, the selector SELa functions as a conductor having a low resistance value. When the selector SELa is in an ON state, a current flows between the local source line LSLa and the local bit line LBLa coupled to the memory cell MCa. Namely, the selector SELa is capable of switching between passing or not passing a current according to the magnitude of the voltage applied to the memory cell MCa, regardless of the direction of the current flow.

(Circuit Configuration in Second Storage Region RG2)

Figure 6:
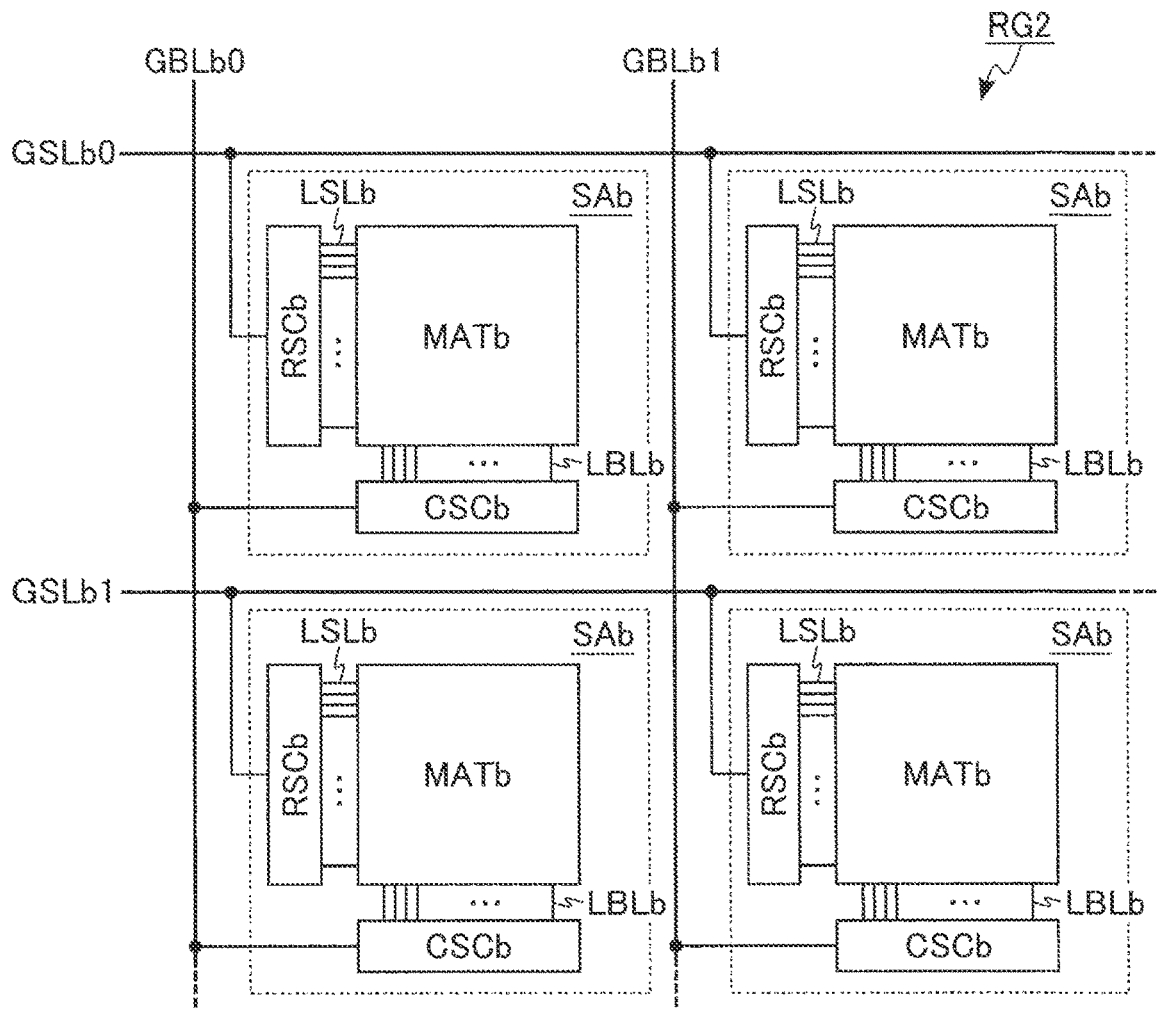
FIG. 6 is a circuit diagram showing a circuit configuration example of sub-arrays included in a second storage region of the core circuit of the memory device according to the first embodiment.

FIG. 6 is a circuit diagram showing a circuit configuration example of the sub-arrays SAb included in the second storage region RG2 of the core circuit 21 of the memory device 20 according to the first embodiment, and also shows interconnects coupled to the sub-arrays SAb. As shown in FIG. 6, the sub-arrays SAb are arranged, for example, in a matrix. The interconnects coupled to the sub-arrays SAb include global source lines GSLb (GSLb0, GSLb1, . . . ) and global bit lines GBLb (GBLb0, GBLb1, . . . ). Each of the sub-arrays SAb include a memory matrix MATb, a row selection circuit RSCb, a column selection circuit CSCb, local source lines LSLb (source lines SL), and local bit lines LBLb (bit lines BL).

The global source lines GSLb and the global bit lines GBLb are configured to be coupled to the sink circuit 31, read circuit 32B, and write circuit 33B, respectively. The sub-arrays SAb are provided in a portion where the global source lines GSLb and the global bit lines GBLb intersect. Namely, each sub-array SAb is associated with one global source line GSLb and one global bit line GBLb. Focusing on one of the sub-arrays SAb, each configuration included in the sub-array SAb will be described below.

The memory matrix MATb includes second memory cells MCb arranged in a matrix. Each of the second memory cells MCb is coupled between one local source line LSLb and one local bit line LBLb. A set including a row address and a column address is allocated to each of the second memory cells MCb. The size (area) of the memory matrix MATb is larger than the size (area) of the memory matrix MATa. The interconnect length of the local source line LSLb is greater than that of the local source line LSLa. The number of second memory cells MCb coupled to one local source line LSLb is greater than the number of first memory cells MCa coupled to one local source line LSLa. The interconnect length of the local bit line LBLb is greater than that of the local bit line LBLa. The number of second memory cells MCb coupled to one local bit line LBLb is greater that the number of first memory cells MCa coupled to one local bit line LBLa. The storage capacity of the memory matrix MATb is larger than the storage capacity of the memory matrix MATa.

The row selection circuit RSCb is coupled to the memory matrix MATb via the local source lines LSLb. The row selection circuit RSCb controls the connection between the global source line GSLb and the local source lines LSLb. The row selection circuit RSCb is supplied with a decoding result (row address) of the address ADD from the decode circuit 25. The row selection circuit RSCb electrically couples one local source line LSLb selected based on the row address and the global source line GSLb associated therewith.

The column selection circuit CSCb is coupled to the memory matrix MATb via the local bit lines LBLb. The column selection circuit CSCb controls the connection between the global bit line GBLb and the local bit lines LBLb. The column selection circuit CSCb is supplied with a decoding result (column address) of the address ADD from the decode circuit 25. The column selection circuit CSCb electrically couples one local bit line LBLb selected based on the column address received from the decode circuit 25 and the global bit line GBLb associated therewith.

(Circuit Configuration of Memory Matrix MATb)

Figure 7:
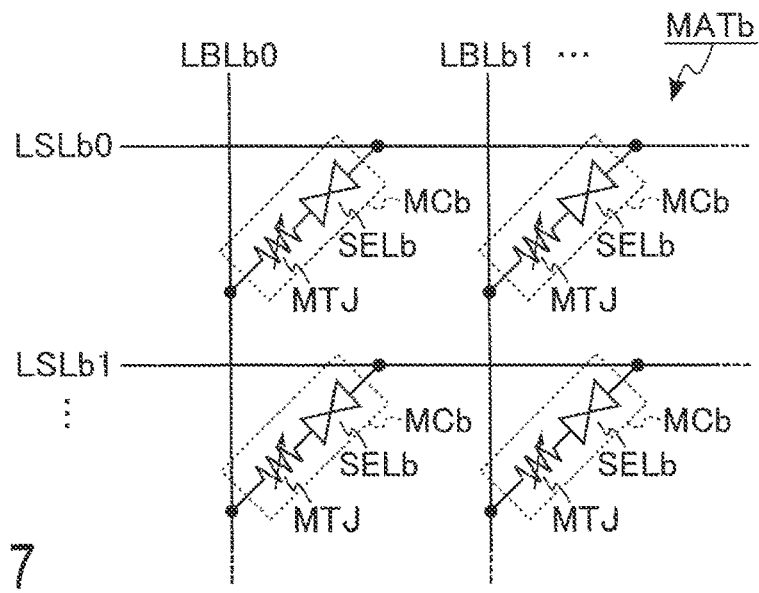
FIG. 7 is a circuit diagram showing a circuit configuration example of a memory matrix included in the second storage region of the core circuit of the memory device according to the first embodiment.

FIG. 7 is a circuit diagram showing a circuit configuration example of the memory matrix MATb included in the second storage region RG2 of the core circuit 21 of the memory device 20 according to the first embodiment. As shown in FIG. 7, the second memory cells MCb are coupled between the local source line LSLb0 and the local bit line LBLb0, between the local source line LSLb0 and the local bit line LBLb1, between the local source line LSLb1 and the local bit line LBLb0, and between the local source line LSLb1 and the local bit line LBLb1.

The second memory cells MCb arranged in the same row are coupled in common to any one of the local source lines LSLb. The second memory cells MCb arranged in the same column are coupled in common to any one of the local bit lines LBLb. Also, each of the second memory cells MCb includes a variable resistance element MTJ and a selector SELb coupled in series. For example, one end of the variable resistance element MTJ is coupled to the local bit line LBLb. The other end of the variable resistance element MTJ is coupled to one end of the selector SELb. The other end of the selector SELb is coupled to the local source line LSLb. The connection relationship between the variable resistance element MTJ and the selector SELb arranged between the local source line LSLb and the local bit line LBLb may be reversed. The variable resistance element MTJ included in the second memory cells MCb and the variable resistance element MTJ included in the first memory cells MCa are the same.

The selector SELb is, for example, a bidirectional diode. The selector SELb functions in a manner similar to the selector SELa. Specifically, the selector SELb included in a memory cell MCb is turned off when the voltage applied to the memory cell MCb is below a threshold voltage Vthb, and turned on when the voltage applied to the memory cell MCb is equal to or greater than the threshold voltage Vthb. In an OFF state, the selector SELb functions as an insulator having a high resistance value. When the selector SELb is in an OFF state, no current flows between the local source line LSLb and the local bit line LELb coupled to the memory cell MCb. In an ON state, the selector SELb functions as a conductor having a low resistance value. When the selector SELb is in an ON state, a current flows between the local source line LSLb and the local bit line LBLb coupled to the memory cell MCb. The threshold voltage Vthb of the selector SELb is set to be higher than the threshold voltage Vtha of the selector SELa.

[1-1-6] Structure of Memory Cell Array 30

Hereinafter, an example of a structure of the memory cell array 30 according to the first embodiment will be described. In the drawings referred to below, "X direction" corresponds to the direction in which the source lines SL extend, "Y direction" corresponds to the direction in which the bit lines BL extend, and "Z direction" corresponds to the direction vertical to the surface of the semiconductor substrate used to form the memory device 20. In the perspective views, hatching is applied, where necessary, for improved visibility. The hatching applied in the perspective view does not necessarily relate to the material or characteristics of the hatched components. In the perspective views and the cross-sectional views, the components are simplified or omitted where necessary, for improved visibility.

(Three-Dimensional Structure of Memory Matrix MAT)

Figure 8:
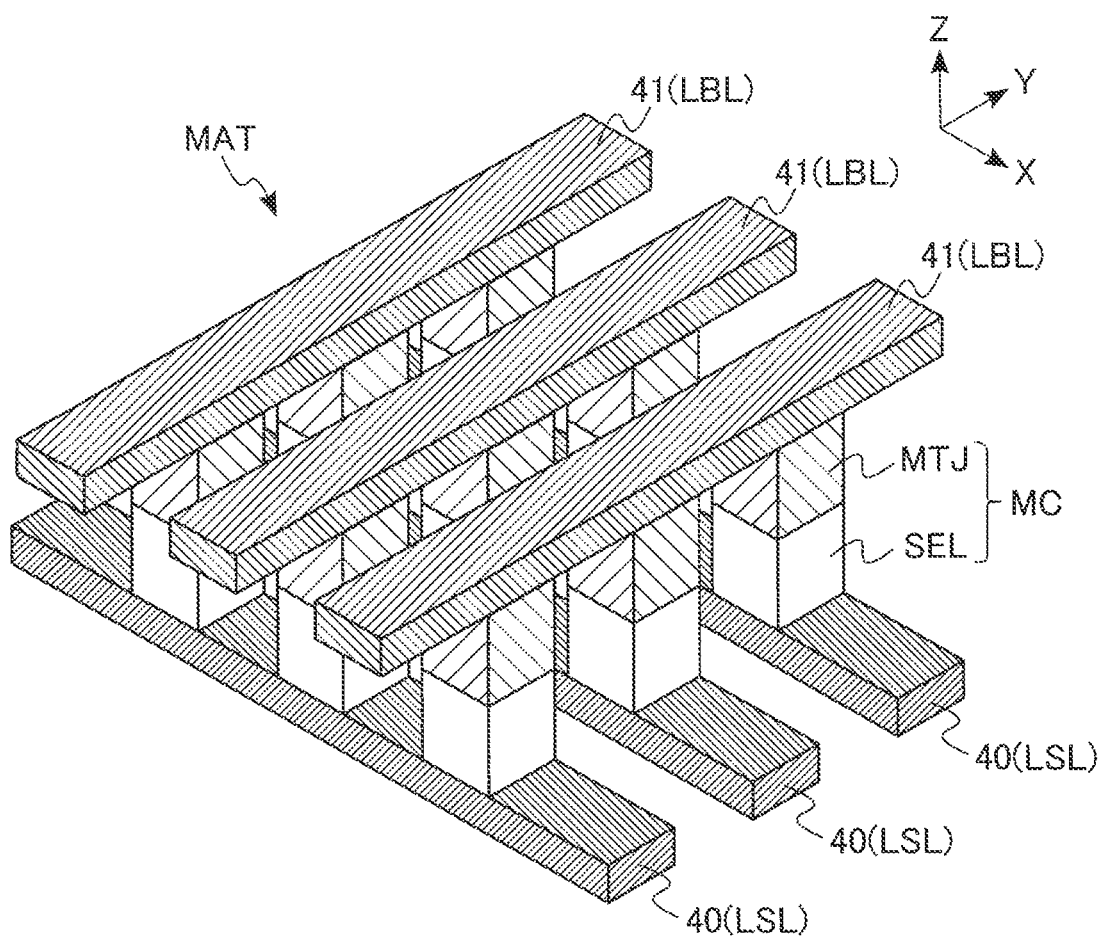
FIG. 8 is a perspective view showing an example of a three-dimensional structure of the memory matrix of the memory device according to the first embodiment.

FIG. 8 is a perspective view showing an example of a three-dimensional structure of the memory matrix MAT of the memory device 20 according to the first embodiment. The structure of the memory matrix MAT in the first storage region RG1 is similar to that of the memory matrix MAT in the second storage region RG2. In this section, an example of the three-dimensional structure similar between the memory matrices MATa and MATb will be described. As shown in FIG. 8, the memory matrix MAT includes conductor layers 40 and conductor layers 41.

Each of the conductor layers 40 has a portion extending in the X direction. The conductor layers 40 are arranged in the Y direction and spaced apart from each other. Each of the conductor layers 40 is used as the local source line LSL.

Each of the conductor layers 41 has a portion extending in the Y direction. The conductor layers 41 are arranged in the X direction and spaced apart from each other. Each of the conductor layers 41 is used as the local bit line LBL.

The conductor layers 41 are arranged above the conductor layers 40. One memory cell MC is provided in each of the portions where the conductor layers 40 and the conductor layers 41 cross each other. Specifically, the selector SEL is provided on each of the conductor layers 40. The variable resistance element MTJ is provided on the selector SEL. The conductor layer 41 is provided on the variable resistance element MTJ.

The cross-sectional structure of the first memory cells MCa of the memory matrix MATa is different from the cross-sectional structure of the second memory cells MCb of the memory matrix MATb. Hereinafter, the cross-sectional structure of the first memory cells MCa and the cross-sectional structure of the second memory cells MCb will be described in the mentioned order.

(Cross-Sectional Structure of Memory Cells MCa)

Figure 9:
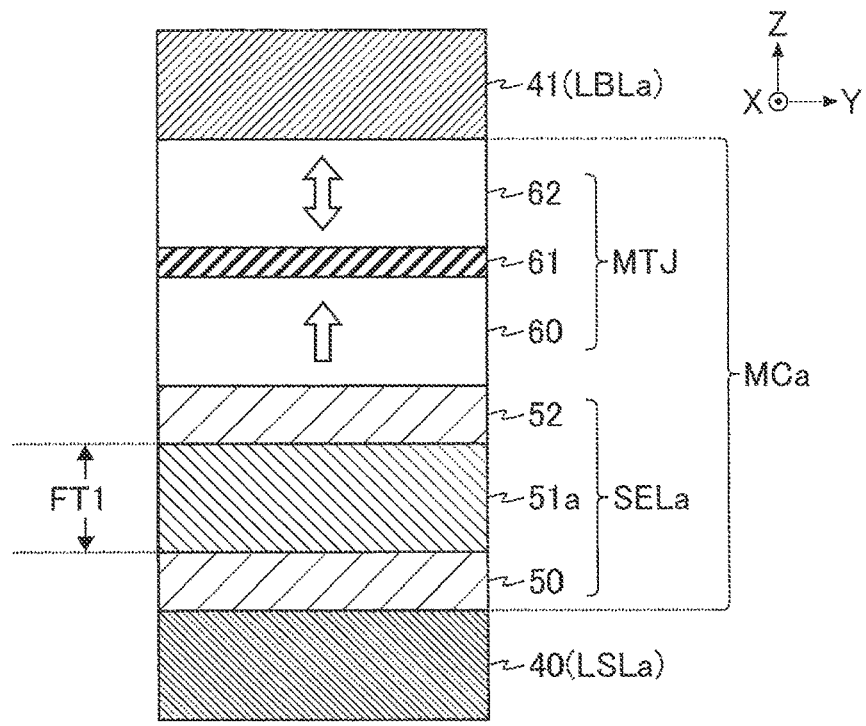
FIG. 9 is a cross-sectional view showing an example of a cross-sectional structure of a first memory cell of the memory device according to the first embodiment.

FIG. 9 is a cross-sectional view showing an example of the cross-sectional structure of the first memory cells MCa of the memory device 20 according to the first embodiment. As shown in FIG. 9, the first memory cell MCa includes, for example, a lower electrode 50, a silicon oxide film 51a, an upper electrode 52, a ferromagnetic layer 60, a nonmagnetic layer 61, and a ferromagnetic layer 62.

A set including the lower electrode 50, silicon oxide film 51a, and upper electrode 52 corresponds to the selector SELa. The lower electrode 50 provided on the conductor layer 40 (local source line LSLa). The silicon oxide film 51a is provided on the lower electrode 50. The upper electrode 52 is provided on the silicon oxide film 51a. Each of the lower electrode 50 and the upper electrode 52 includes TiN, TaN, ect. The silicon oxide film 51a is doped with arsenic (AS). The concentration of As in the silicon oxide film 51a is 30 (at %: atomic percentage) or more. Hereinafter, the thickness (film thickness) of the silicon oxide film 51a along the Z direction will be referred to as "FT1".

A set including the ferromagnetic layer 60, nonmagnetic layer 61, and ferromagnetic layer 62 corresponds to the variable resistance element MTJ. The ferromagnetic layer 60 is provided on the upper electrode 52. The nonmagnetic layer 61 is provided on the ferromagnetic layer 60. The ferromagnetic layer 62 is provided on the nonmagnetic layer 61. The conductor layer 41 (local bit line LBLa) is provided on the ferromagnetic layer 62.

Each of the ferromagnetic layers 60 and 62 is formed of a ferromagnet and has a magnetization direction perpendicular to the film surface. For example, the magnetization direction of the ferromagnetic layer 60 is fixed and the magnetization direction of the ferromagnetic layer 62 is variable. In this case, the ferromagnetic layer 60 functions as a reference layer of the MTJ element, and the ferromagnetic layer 62 functions as a storage layer of the MTJ element. The nonmagnetic layer 61 is formed of an insulator, such as MgO, and functions as a tunnel barrier layer. The ferromagnetic layers 60 and 62 form a magnetic tunnel junction together with the nonmagnetic layer 61. Such a variable resistance element MTJ functions as a perpendicular magnetization-type MTJ element that utilizes the tunneling magnetoresistance (TMR) effects.

The variable resistance element MTJ may be in either a low-resistance state or a high-resistance state according to the relative relationship between the magnetization directions of the ferromagnetic layers 60 and 62. Also, the variable resistance element MTJ stores data according to the magnetization direction of the ferromagnetic layer 62 (storage layer). For example, the variable resistance element MTJ in which the magnetization directions of the reference layer and the storage layer are in an anti-parallel state (AP state) is in a high-resistance state (data "1"). On the other hand, the variable resistance element MTJ in which the magnetization directions of the reference layer and the storage layer are in a parallel state (P state) is in a low-resistance state (data "0").

In this example, the variable resistance element MTJ falls into the AP State when a write current is passed in a direction from the ferromagnetic layer 60 toward the ferromagnetic layer 62, and falls into the P state when a write current is passed in a direction from the ferromagnetic layer 62 toward the ferromagnetic layer 60. A write method in which spin torque is injected into the storage layer and the reference layer by passing a write current to the variable resistance element MTJ in this manner, and the magnetization direction of the storage layer is thereby controlled, will be referred to as a "spin-injection write method". The variable resistance element MTJ is configured so that the magnetization direction of the ferromagnetic layer 60 remains unchanged when a current having a magnitude that may invert the magnetization direction of the ferromagnetic layer 62 is passed to the variable resistance element MTJ.

Herein, the expression "the magnetization direction is variable" means that the magnetization direction changes in response to a write current. The expression "the magnetization direction is fixed" means that the magnetization direction does not change in response to a write current. In the variable resistance element MTJ, the arrangement of the storage layer and the reference layer may be reversed. The variable resistance element MTJ may also include other layers. For example, the variable resistance element MTJ may include a shift canceling layer which suppresses the influence of the stray field of the reference layer, a synthetic anti-ferromagnetic (SAF) structure, and the like.

(Cross-Sectional Structure of Memory Cells MCb)

Figure 10:
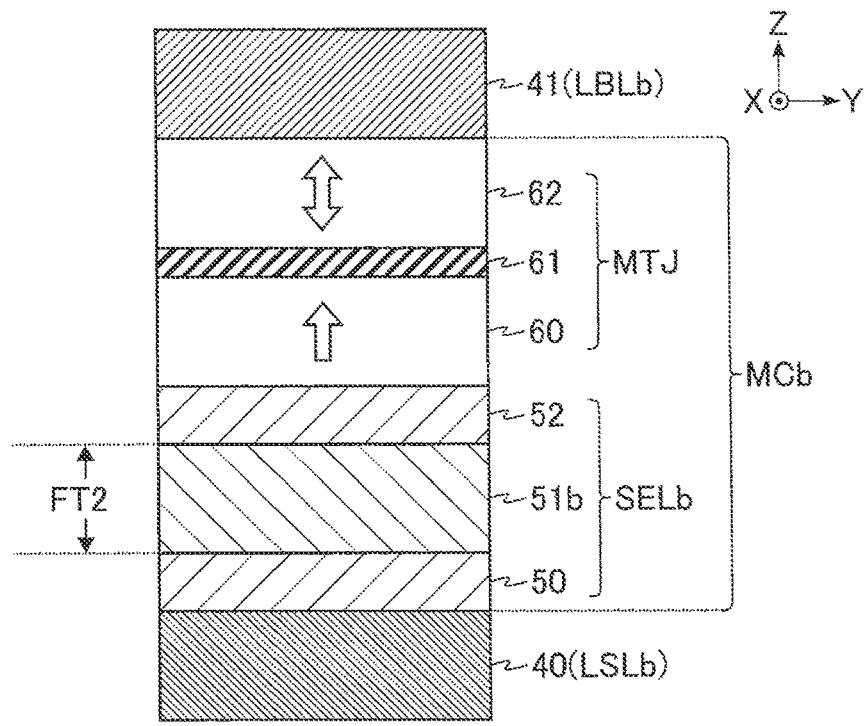
FIG. 10 is a cross-sectional view showing an example of a cross-sectional structure of a second memory cell of the memory device according to the first embodiment.

FIG. 10 is a cross-sectional view showing an example of the cross-sectional structure of the second memory cells MCb of the memory device 20 according to the first embodiment. As shown in FIG. 10, the second memory cell MCb includes, for example, a lower electrode 50, a silicon oxide film 51b, an upper electrode 52, a ferromagnetic layer 60, a nonmagnetic layer 61, and a ferromagnetic layer 62.

A set including the lower electrode 50, silicon oxide film 51b, and upper electrode 52 corresponds to the selector SELb. The lower electrode 50 is provided on the conductor layer 40 (local source line LSLb). The silicon oxide film 51b is provided on the lower electrode 50. The thickness FT2 of the silicon oxide film 51b along the Z direction is approximately equal to the thickness FT1 of the silicon oxide film 51a. The upper electrode 52 is provided on the silicon oxide film 51b.

The silicon oxide film 51b is doped with arsenic, as in the case of the silicon oxide film 51a. The concentration of As in the silicon oxide film 51b is 10 (at %) or less. Namely, in the memory device 20 according to the first embodiment, the As concentration (≥30 (at %)) of the selector SELa used in a small MAT (MATa) is set to be higher than the As concentration (≤10 (at %)) of the selector SELb used in a large MAT (MATb). The As concentration of the selector SELa differs from that of the selector SELb by at least a single digit. The difference between the threshold voltage of the selector SELa and that of the selector SELb is set based on the difference between the As concentrations thereof. The other structures of the memory cells MCb are the same as those of the memory cells MCa.

[1-2] Operation

Figure 11:
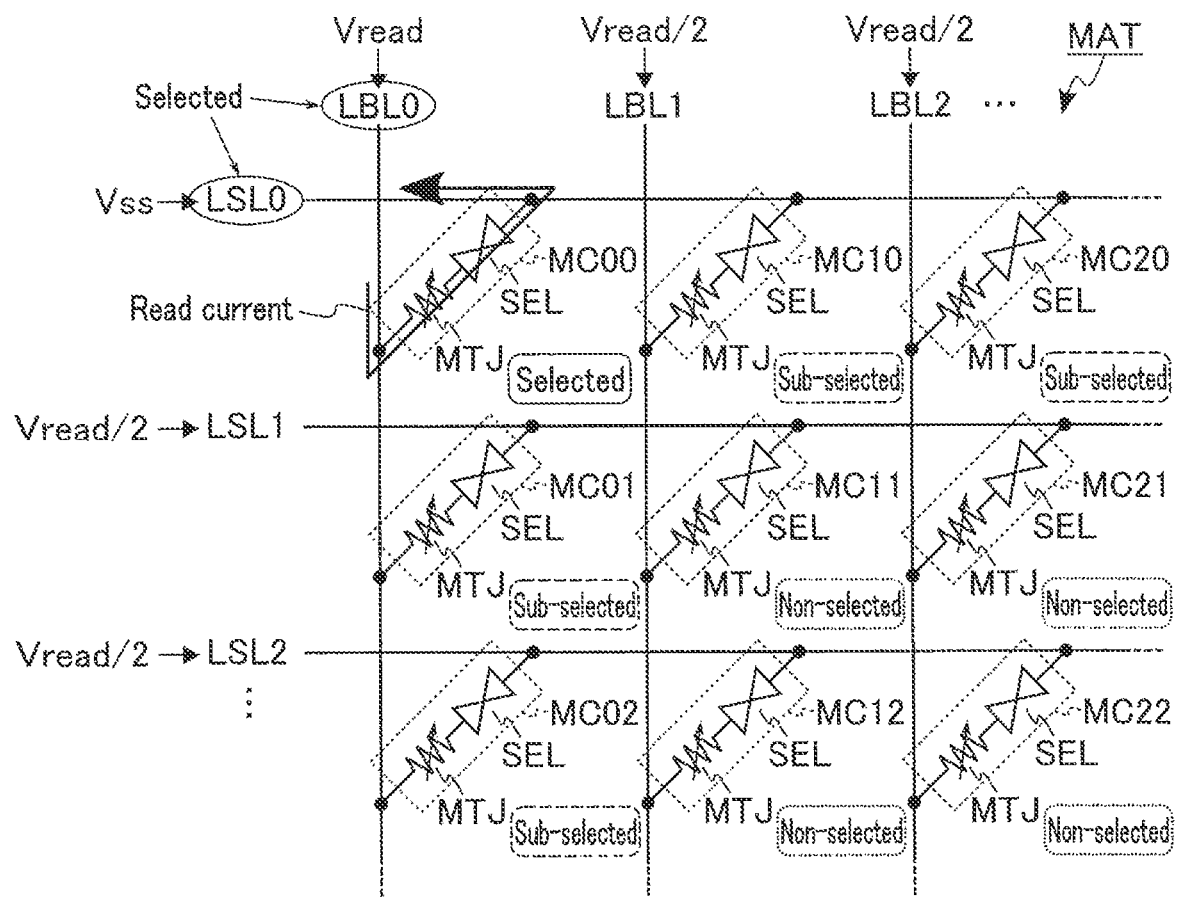
FIG. 11 is a schematic diagram showing an example of a read operation of the memory device according to the first embodiment.

FIG. 11 is a schematic diagram showing an example of a read operation of the memory device 20 according to the first embodiment, and illustrates an example of a voltage applied to each interconnect at a certain time. In the read operation, the memory device 20 performs a read operation in which one bit line BL and one source line SL are selected, as shown in FIG. 11. Hereinafter, a read operation in which the local bit line LBL0 and the local source line LSL0 are selected will be illustrated.

In the illustration below, a memory cell MC that is selected will be referred to as a "selected memory cell MC". A set including a local source line LSL and a local bit line LBL associated with the selected memory cell MC will be referred to as a "selected local source line" and a "selected local bit line", respectively. The local source lines LSL other than the selected local source line will be referred to as "non-selected local source lines". The local bit lines LBL other than the selected local bit line will be referred to as "non-selected local bit lines". Memory cells MC coupled to both the selected local source line and the non-selected local bit lines, and memory cells MC coupled to both the selected local bit line and the non-selected local source lines will be referred to as "sub-selected memory cells MC".

In the read operation, Vss is applied to the selected local source line (LSL0). Vread/2 is applied to each of the non-selected local source lines (LSS1, LSL2, . . . ). Vread is applied to the selected local bit line (LBL0). Vread/2 is applied to each of the non-selected local bit lines (LBL1, LBL2, . . . ). Vss is a ground voltage. Vread is a read voltage higher than Vss. It is preferable that the voltages applied to the non-selected local source lines and the non-selected local bit lines be approximately the same.

Thereby, a voltage in a first direction (a direction from the local source lines LSL toward the local bit lines LBL) is applied to the selected memory cell (MC00). A voltage is applied in the first direction to the sub-selected memory cells (MC01, MC02, . . . ) coupled to the selected local bit line (LBL0). A voltage is applied in the first direction to the sub-selected memory cells (MC10, MC20, . . . ) coupled to the selected local source line (LSL0). Since approximately the same voltage is being applied to both ends of the sub-selected memory cells MC, a difference in voltage therebetween is suppressed.

A difference in voltage between both ends of the selected memory cell MC is greater than that between both ends of the sub-selected memory cells MC, and is equal to or greater than the threshold voltage of the selector SEL. On the other hand, the difference in voltage between both ends of the sub-selected memory cells MC is less than the threshold voltage of the selector SEL. As a result, a read current through the selected memory cell (MC00) may flow from the selected local bit line (LBL0) toward the selected local source line (LSL0). On the other hand, a current flow between the non-selected local bit lines LBL and the non-selected local source lines LSL via the non-selected memory cells MC is suppressed. Furthermore, a current flow between the selected local bit line (LBL0) and the non-selected local source lines LSL or between the non-selected local bit lines LBL and the selected local source line (LSL0) is suppressed.

The magnitude of a read current flowing through the selected memory cell MC varies depending on the resistance state of the variable resistance element MTJ included in the selected memory cell MC. Therefore, the read circuit 32 can determine the data stored in the selected memory cell MC by detecting the read current flowing through the selected memory cell MC via the global bit line GBL connected to the selected local bit line LBL.

As described above, the sub-selected memory cells MC exist in the read operation of the memory device 20 including the memory cells MC using a two-terminal selector SEL. The sub-selected memory cells MC also exist in the write operation. In the memory device 20 according to the first embodiment, a threshold voltage of the selector SELa used in the memory matrix MATa and a threshold voltage of the selector SELb used in the memory matrix MATb are different; therefore, the setting of the read voltage Vread used in the read operation and the write voltage used in the write operation is preferably optimized in each of the memory matrices MATa and MATb.

[1-3] Manufacturing Method

Figure 12:
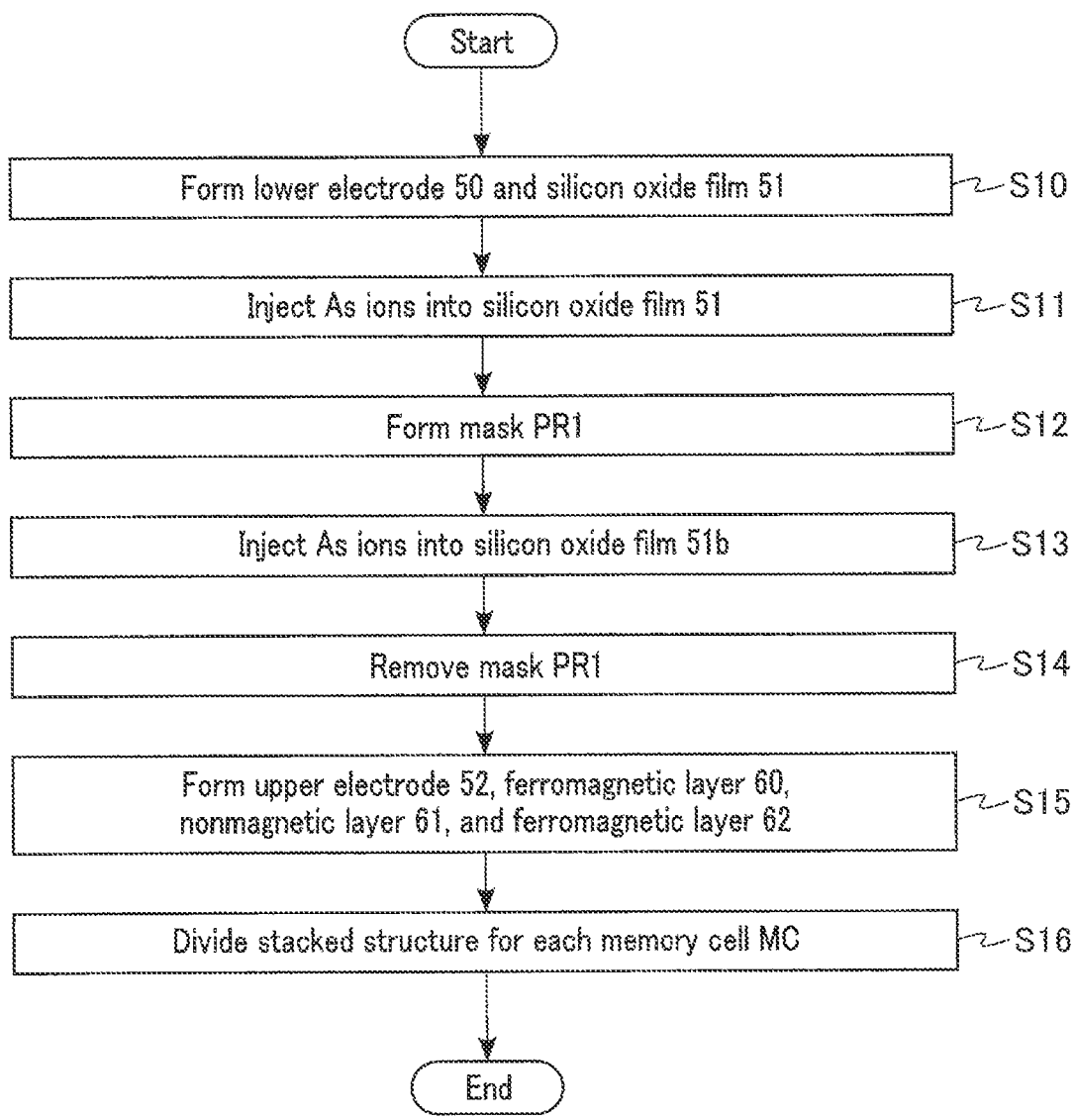
FIG. 12 is a flowchart showing an example of a method of manufacturing the memory device according to the first embodiment.

FIG. 12 is a flowchart showing an example of a method of manufacturing the memory device 20 according to the first embodiment. Each of FIGS. 13 to 18 is a cross-sectional view showing an example of the cross-sectional structure in the course of manufacturing the memory device 20 according to the first embodiment, and showing a cross section including the first storage region RG1 and the second storage region RG2. By referring to FIG. 12 as necessary, an example of a method of forming the selectors SELa and SELb and the MTJ element of the first embodiment will be described below.

Figure 13:
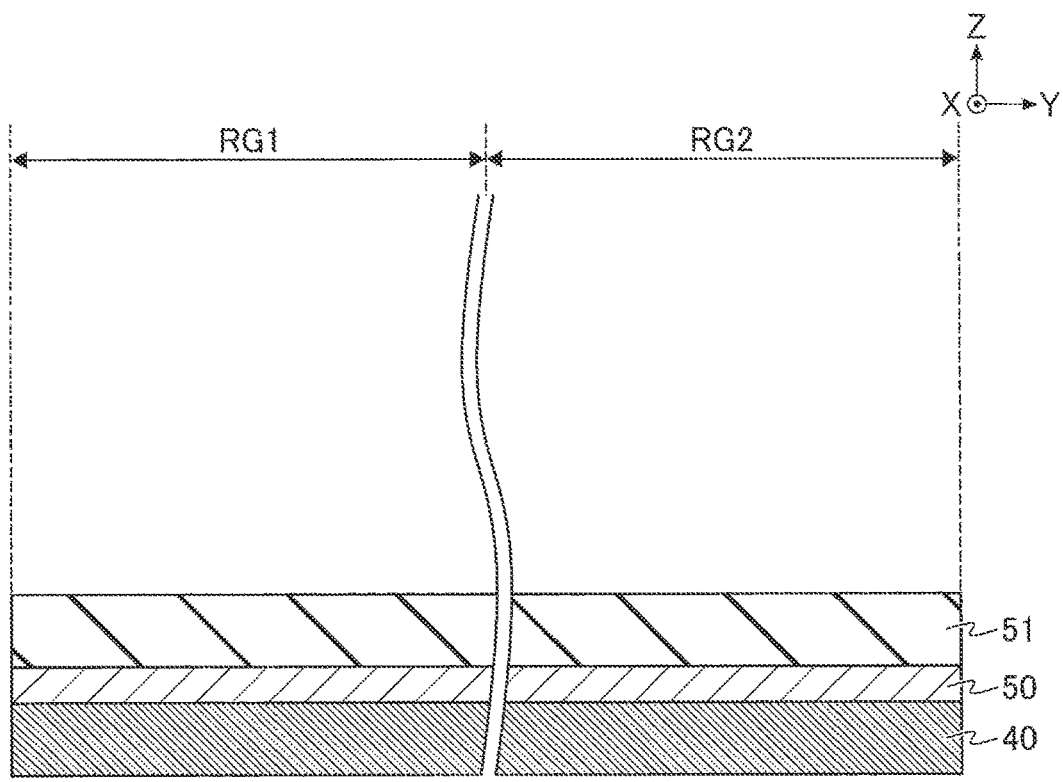
FIGS. 13, 14, 15, 16, 17, and 18 are cross-sectional views showing an example of a cross-sectional structure of the memory device according to the first embodiment during manufacture of the memory device.

First, the lower electrode 50 and the silicon oxide film 51 are formed, as shown in FIG. 13 (step S10). Specifically, a conductor used as the lower electrode 50 and the silicon oxide film 51 are stacked on the conductor layer 40 (local source line LSL) in this order.

Figure 14:
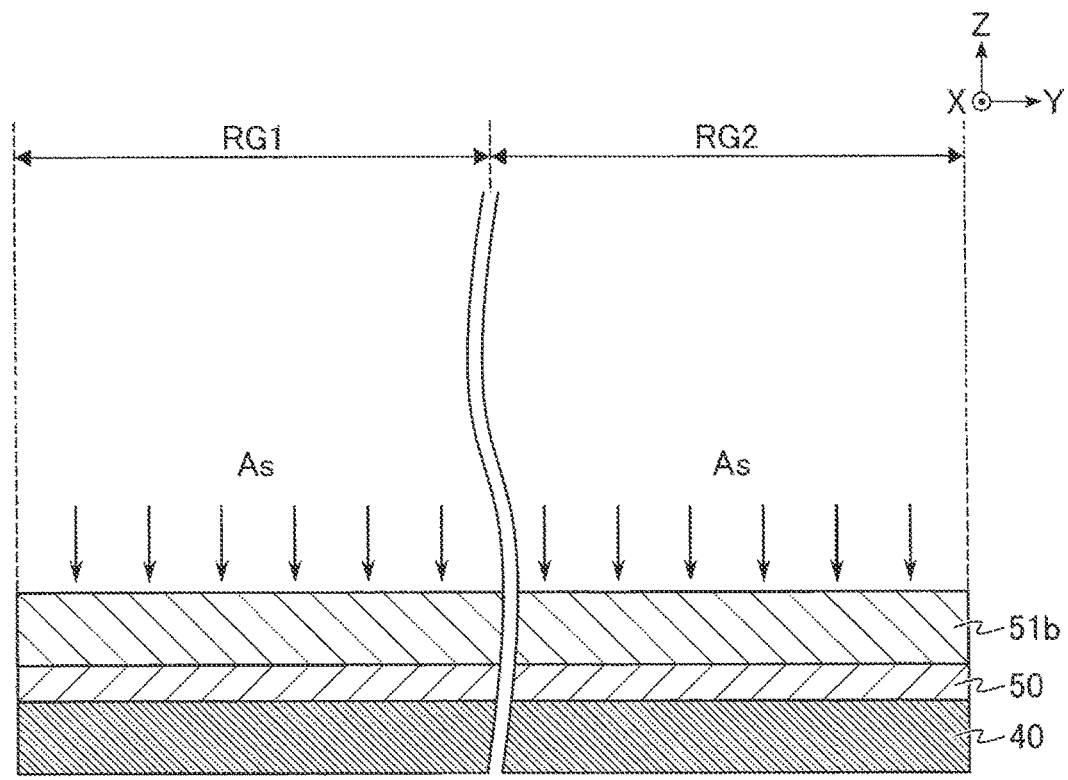

Next, As ions are injected into the silicon oxide film 51, as shown in FIG. 14 (step S11). Specifically, the silicon oxide film 51 is doped with arsenic by the ion injection processing using As ions. In this ion injection processing, the As concentration in the silicon oxide film 51 is set to be an As concentration having a designed value of the selector SELb. Namely, through the processing of step S11, the silicon oxide film 51b is formed.

Figure 15:
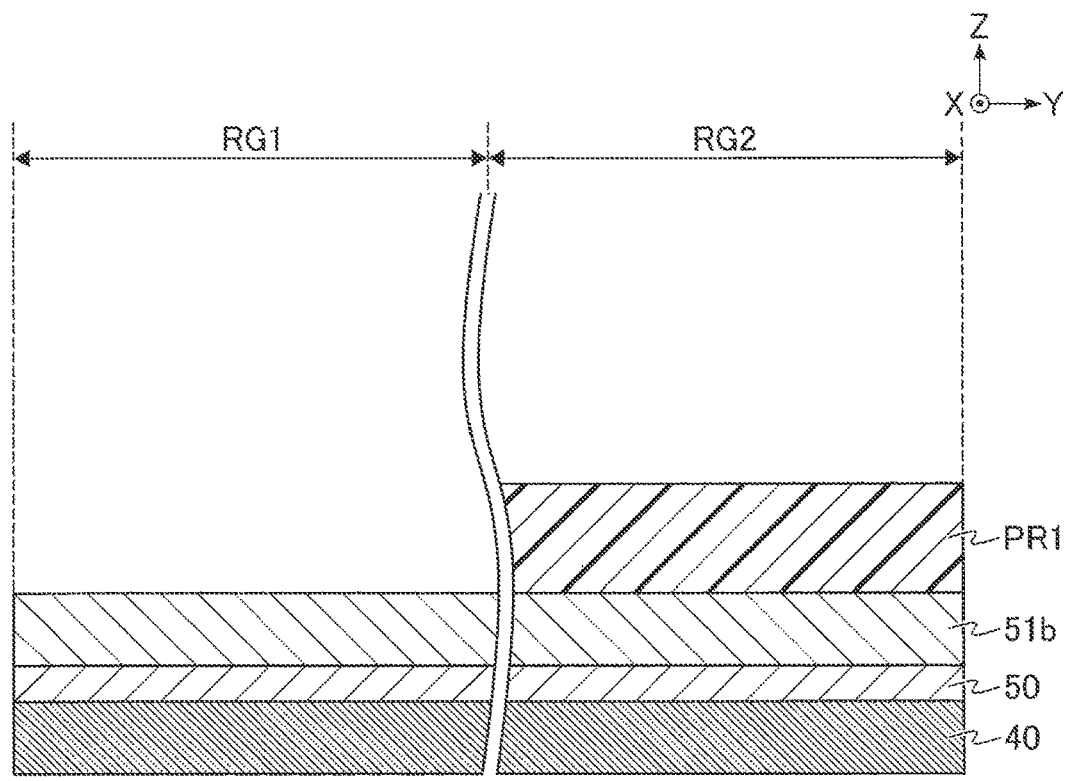

Next, a mask PR1 is formed, as shown in FIG. 15 (step S12). For example, photolithography is utilized to form the mask PR1. The mask PR1 covers a portion corresponding to the second storage region RG2. On the other hand, in the mask PR1, a portion corresponding to the first storage region RG1 is opened. Namely, in the first storage region RG1, the surface of the silicon oxide film 51b is exposed.

Figure 16:
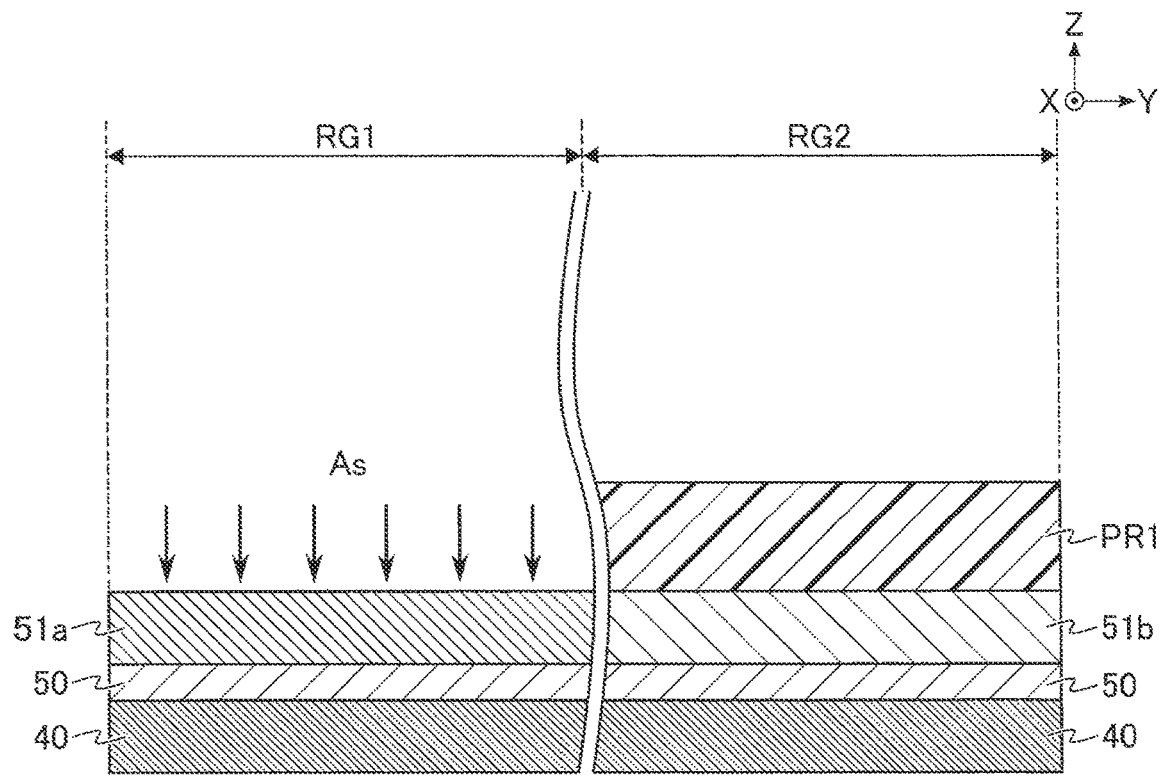

Next, As ions are injected into the silicon oxide film 51b, as shown in FIG. 16 (step S13). Specifically, the ion injection processing using As ions is performed using the mask PR1. In this case, an opening of the mask PR1, that is, the silicon oxide film 51b in the first storage region RG1, is doped with arsenic. In this ion injection processing, the As concentration in the silicon oxide film 51b in the first storage region RG1 is set to be an As concentration having a designed value of the selector SELa. Namely, through the processing of step S13, the silicon oxide film 51a is formed in the first storage region RG1. As a result, a structure in which the As concentration of the silicon oxide film 51 differs between the first storage region RG1 and the second storage region RG2.

Next, the mask PR1 is removed (step S14).

Figure 17:
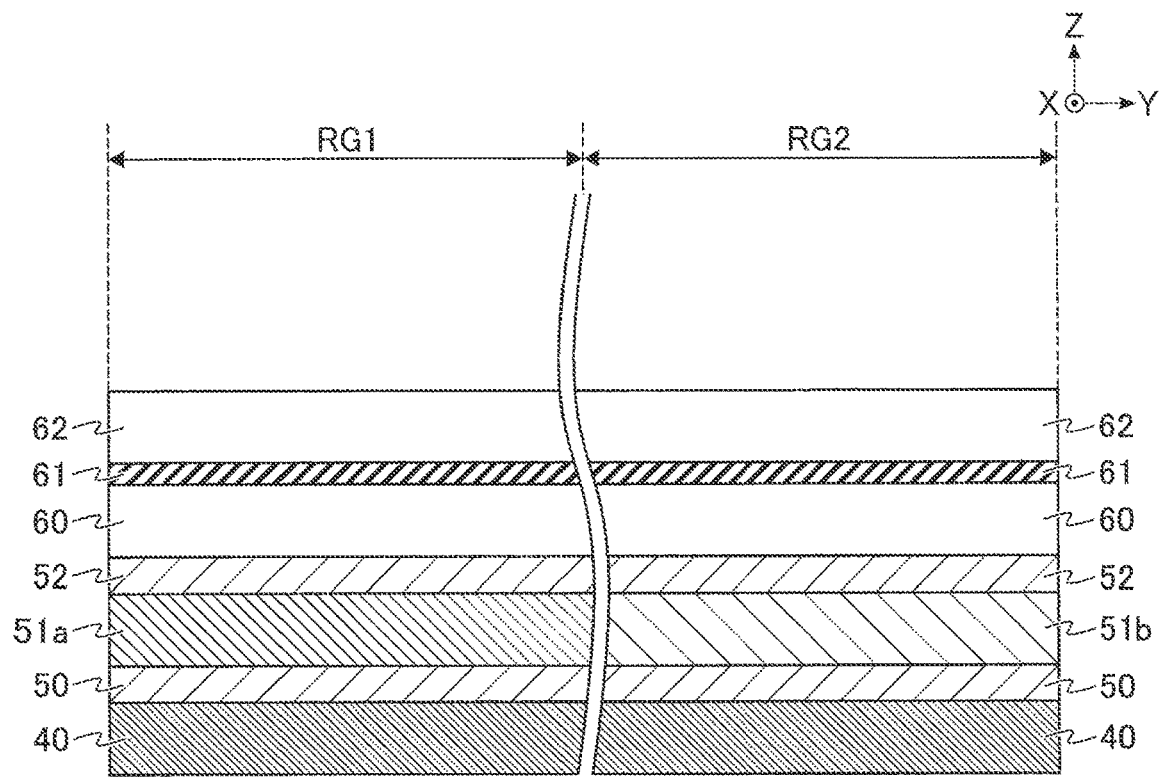

Then, the upper electrode 52, the ferromagnetic layer 60, the nonmagnetic layer 61, and the ferromagnetic layer 62 are formed, as shown in FIG. 17 (step S15). Specifically, a conductor used as the upper electrode 52, the ferromagnetic layer 60, the nonmagnetic layer 61, and the ferromagnetic layer 62 are stacked on the silicon oxide films 51a and 51b in this order.

Figure 18:
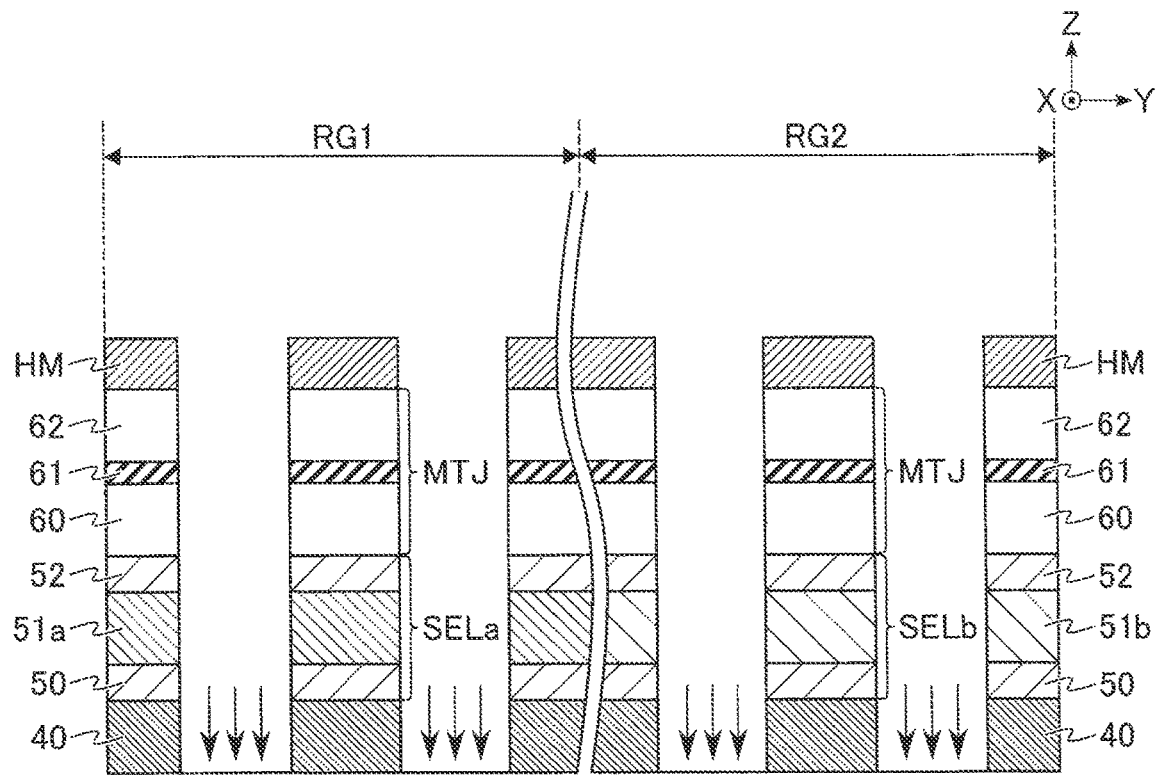

Next, the stacked structure is divided for each memory cell MC, as shown in FIG. 18 (step S16). This "stacked structure" includes a stacked structure (the lower electrode 50, the silicon oxide films 51a and 51b, and the upper electrode 52) corresponding to the selector SEL and a stacked structure (the ferromagnetic layer 60, the nonmagnetic layer 61, and the ferromagnetic layer 62) corresponding to the variable resistance element MTJ.

In a nutshell, first, a hard mask HM covering a portion corresponding to the local source line LSL is formed. Anisotropic etching processing, such as reactive ion etching (RIE), is performed using the hard mask HM. As a result, for example, each of the ferromagnetic layer 62, the nonmagnetic layer 61, the ferromagnetic layer 60, the upper electrode 52, the silicon oxide films 51a and 51b, the lower electrode 50, and the conductor layer 40 is divided.

Then, for example, a hard mask having a plurality of openings extending along the depth direction (X direction) in FIG. 18 is formed (not shown), and anisotropic etching using the hard mask is performed. As a result, a structure of the memory cells MC in which each is coupled to one local bit line LBL and one local source line LSL is formed. A memory cell MC formed in the first storage region RG1 corresponds to the memory cell MCa including the selector SELa that uses the silicon oxide film 51a. A memory cell formed in the second storage region RG2 corresponds to the memory cell MCb including the selector SELb that uses the silicon oxide film 51b.

Through the manufacturing process described above, the selectors SELa and SELb, and the memory cells MC according to the first embodiment are formed. Impurities added to the silicon oxide films 51a and 51b are activated by performing thermal processing after the ion injection processing. The timing at which impurities added to the silicon oxide films 51a and 51b may be set appropriately. Different processing may be added between the respective processing acts described above, and the number and the type of layers formed in the processing of step S10 and step S15 may be increased based on the structures of the selector SEL and variable resistance element MTJ. The hard mask HM may be removed, and the local bit line LBL may be coupled to the top of the hard mask HM.

(Detailed Designs of Selectors SELa and SELb)

Figure 19:
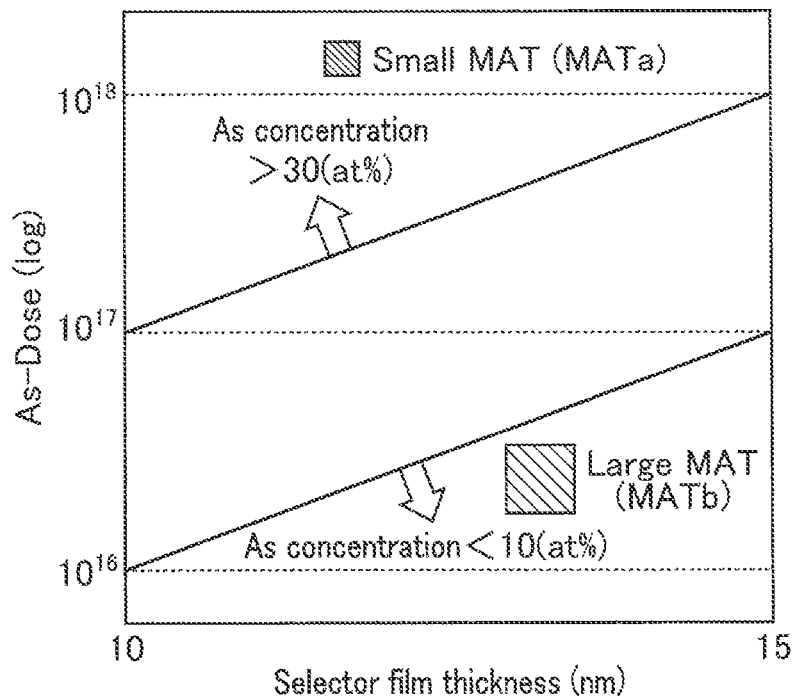
FIG. 19 is a graph showing a relationship in the selector film thickness and the dose amount between the first memory cell and the second memory cell of the memory device according to the first embodiment.

FIG. 19 is a graph showing a relationship in the selector film thickness and the dose amount between the first memory cell MCa and the second memory cell MCb of the memory device 20 according to the first embodiment. The horizontal axis in FIG. 19 shows the selector film thickness, that is, the film thickness of the silicon oxide film 51. The vertical axis in FIG. 19 shows As-Dose (log), that is, the setting of the dose amount of arsenic (As) during the ion injection processing, in a log scale. Hereinafter, an example of the setting of the ion injection processing used to form the selectors SELa and SELb of the memory device 20 according to the first embodiment will be described with reference to FIG. 19.

In the case of ion injection processing in which the As dose amount is set to be larger than $10^{17}$ when the selector film thickness is 10 nm, the As concentration of the selector SEL may exceed 30 (at %). In the case of ion injection processing in which the dose amount of As is set larger than $10^{18}$ when the selector film thickness is 15 nm, the As concentration of the selector SEL may exceed 30 (at %). The ion injection processing to which these settings are applied (e.g., step S13) can form the silicon oxide film 51a having a concentration suitable for a small MAT (MATa).

In the case of ion injection processing in which the dose amount of As is set to be smaller than $10^{16}$ when the selector film thickness is 10 nm, the As concentration of the selector SEL may fall below 10 (at %). In the case of ion injection processing in which the dose amount of As is set to be smaller than $10^{17}$ when the selector film thickness is 15 nm, the As concentration of the selector SEL may fall below 10 (at %). The ion injection processing to which these settings are applied (e.g., step S11) can form the silicon oxide film 51b having a concentration suitable for a large MAT (MATb).

As described above, the As concentration of the silicon oxide film 51 is determined based on the relationship between the dose amount of As in the ion injection processing and the selector film thickness (film thickness of the silicon oxide film 51). If it is possible for the silicon oxide film 51 having an appropriate As concentration in the selectors SELa and SELb to be formed, settings other than those described above may also be used.

In the memory device 20 according to the first embodiment, the selector film thicknesses of the memory cell MCa and the memory cell MCb are approximately equal. Therefore, ion injection processing is performed multiple times on the silicon oxide film 51 in the first storage region RG1, which is preferably doped with As at a high concentration. The ion injection processing need not necessarily be performed in this manner; ion injection processing directed to the selector SELa and the selector SELb may be performed separately. In this case, the silicon oxide film 51a is formed by single ion injection processing using a mask in which the region of the selector SELa is opened, and the silicon oxide film 51b is formed by single ion injection processing using a mask in which the region of the selector SELb is opened.

[1-4] Advantageous Effects of First Embodiment

With the memory system 1 according to the first embodiment described above, the performance of the memory device 20 can be improved. The advantageous effects of the memory system 1 according to the first embodiment will be detailed below.

In order to maximize the performance of the memory system, a single module preferably includes, for example, a storage class memory (SCM) and a dynamic random access memory (DRAM). For example, a variable resistance memory including a memory cell array having a cross-point structure is used as SCM. DRAM stores data frequently accessed and is used as a cache region of the memory system. However, to add a chip of DRAM to the memory system causes memory system costs to increase.

To address this, a part of the storage region of the SCM may be used as a cache memory, as in the case of DRAM. The configuration of such a memory system can suppress cost and improve the performance of the entire memory system. When a variable resistance memory such as MRAM is used as SCM, lowering a threshold voltage of the selector SEL used to select a memory cell MC in the memory matrix MAT can improve the latency in the read operation and the write operation performed on the memory matrix MAT, and can thus enhance access performance.

Figure 20:
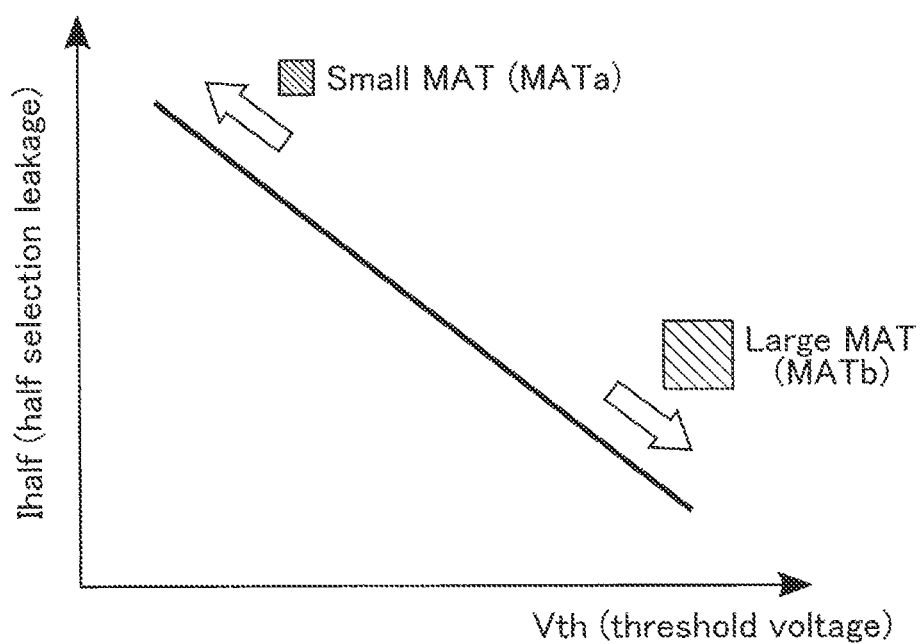
FIG. 20 is a graph showing a relationship between a threshold voltage of a selector and a half selection leakage of a sub-selected memory cell.

FIG. 20 is a graph showing a relationship between a threshold voltage of the selector SEL and a half selection leakage of the sub-selected memory cell MC. Vth indicates a threshold voltage of the selector SEL. Ihalf indicates the magnitude of the half selection leakage from the sub-selected memory cell MC during the read operation. As shown in FIG. 20, the lower the threshold voltage of the selector SEL, the larger Ihalf, and the higher the threshold voltage of the selector SEL, the smaller Ihalf.

The selector SEL having a low threshold voltage (hereinafter referred to as a "low-Vth selector SEL") has a favorable write endurance. For example, a silicon oxide film doped with arsenic at a high concentration is used as the low-Vth selector SEL. Since a voltage needed to turn on the low-Vth selector SEL is low, an operation voltage can be lowered, leading to reduction of the power consumption. Also, in order to correctly determine the data of the memory cell MC, the total amount of Ihalf must be suppressed. Ihalf may produce a noise when reading data of the selected memory cell MC. Therefore, when the low-Vth selector SEL with possibly a high Ihalf is used, it is preferable to suppress the number of memory cells MC coupled to one local bit line LBL. Namely, it is difficult to increase the size of a memory matrix MAT which adopts the low-Vth selector SEL, resulting in a low storage capacity.

On the other hand, a selector SEL having a high threshold voltage (hereinafter referred to as a "high-Vth selector SEL") has a write endurance lower than that of the low-Vth selector SEL. For example, a silicon oxide film doped with arsenic at a low concentration is used as the high-Vth selector SEL. Since a voltage needed to turn on the high-Vth selector SEL is high, an operation voltage must be increased, leading to an increase in power consumption. In addition, when the high-Vth selector SEL possibly having Ihalf lower than that of the low-Vth selector SEL is used, it is possible to increase the number of memory cells MC coupled to one local bit line LBL, as compared with the case where the low-Vth selector SEL is used. Namely, it is possible to increase the size of the memory matrix MAT which adopts the high-Vth selector SEL, as compared with the memory matrix MAT which adopts the low-Vth selector SEL, allowing for an increase in the storage capacity.

In the memory system 1 according to the first embodiment, the memory device 20 includes two types of memory matrices MATa and MATb that include selectors SEL having different threshold voltages. Specifically, the memory matrix MATa includes the low-Vth selector SELa and exhibits high performance. On the other hand, the memory matrix MATb includes the high-Vth selector SELb and has a large storage capacity.

FIG. 21 is a schematic diagram showing an example of a method of using the memory system 1 according to the first embodiment, and shows one memory matrix MATa and one memory matrix MATb extracted from the memory device 20. As shown in FIG. 21, the memory system 1 stores data that may be accessed frequently in the memory matrix MATa, and stores data accessed non-frequently in the memory matrix MATb. The data that that may be accessed frequently is, for example, program computation data. The data accessed non-frequently is, for example, program data.

In other words, when the memory controller 10 receives write data given attributes so that it may be accessed frequently from the host device 2, the memory controller 10 instructs the memory device 20 to write the write data to the memory matrix MATa. On the other hand, when the memory controller 10 receives write data given attributes so that it will be accessed non-frequently from the host device 2, the memory controller 10 instructs the memory device 20 to write the write data to the memory matrix MATb. Namely, the memory controller 10 can change write destinations (the memory matrices MATa and MATb) in the memory device 20 according to the frequency of accessing the write data.

As described above, the memory system 1 according to the first embodiment can use the memory matrix MATa as a buffer memory such as DRAM, and can use the memory matrix MATb as a storage region having a large capacity. As a result, the memory system 1 according to the first embodiment can achieve both the performance and the storage capacity and maximize the chip performance. Namely, the memory system 1 according to the first embodiment can enhance the performance of the memory device 20.

[2] Second Embodiment

A memory device 20 according to the second embodiment can exhibit the same effects as those of the first embodiment by changing the thicknesses of the selectors SEL between the memory matrices MATa and MATb. Hereinafter, differences of the memory device 20 according to the second embodiment from the first embodiment will be described.

[2-1] Cross-Sectional Structure of Memory Cells MCa

FIG. 22 is a cross-sectional view showing an example of the cross-sectional structure of a first memory cell MCa of the memory device 20 according to the second embodiment. As shown in FIG. 22, the first memory cell MCa according to the second embodiment has a configuration in which the silicon oxide film 51a in the selector SELa, in the first memory cells MCa described in the first embodiment, is replaced by a silicon oxide film 51c. On the other hand, the configuration of a second memory cell MCb of the second embodiment is the same as that of the second memory cell MCb described in the first embodiment.

Specifically, the silicon oxide film 51c is doped with arsenic. The As concentration of the silicon oxide film 51c is higher than that of the silicon oxide film 51b and approximately equal to that of the silicon oxide film 51a. The thickness FT3 of the silicon oxide film 51c along the Z direction is smaller than the thickness FT2 of the silicon oxide film 51b. Therefore, the height of the first memory cell MCa of the second embodiment is lower than that of the second memory cell MCb of the second embodiment. As in the case of the first embodiment, the threshold voltage of the selector SELa is lower than that of the selector SELb. The other structures of the first memory cells MCa according to the second embodiment are the same as those of the first memory cells MCa described in the first embodiment. Also, the other configurations of the memory system 1 according to the second embodiment are the same as those of the first embodiment.

[2-2] Manufacturing Method

Figure 23:
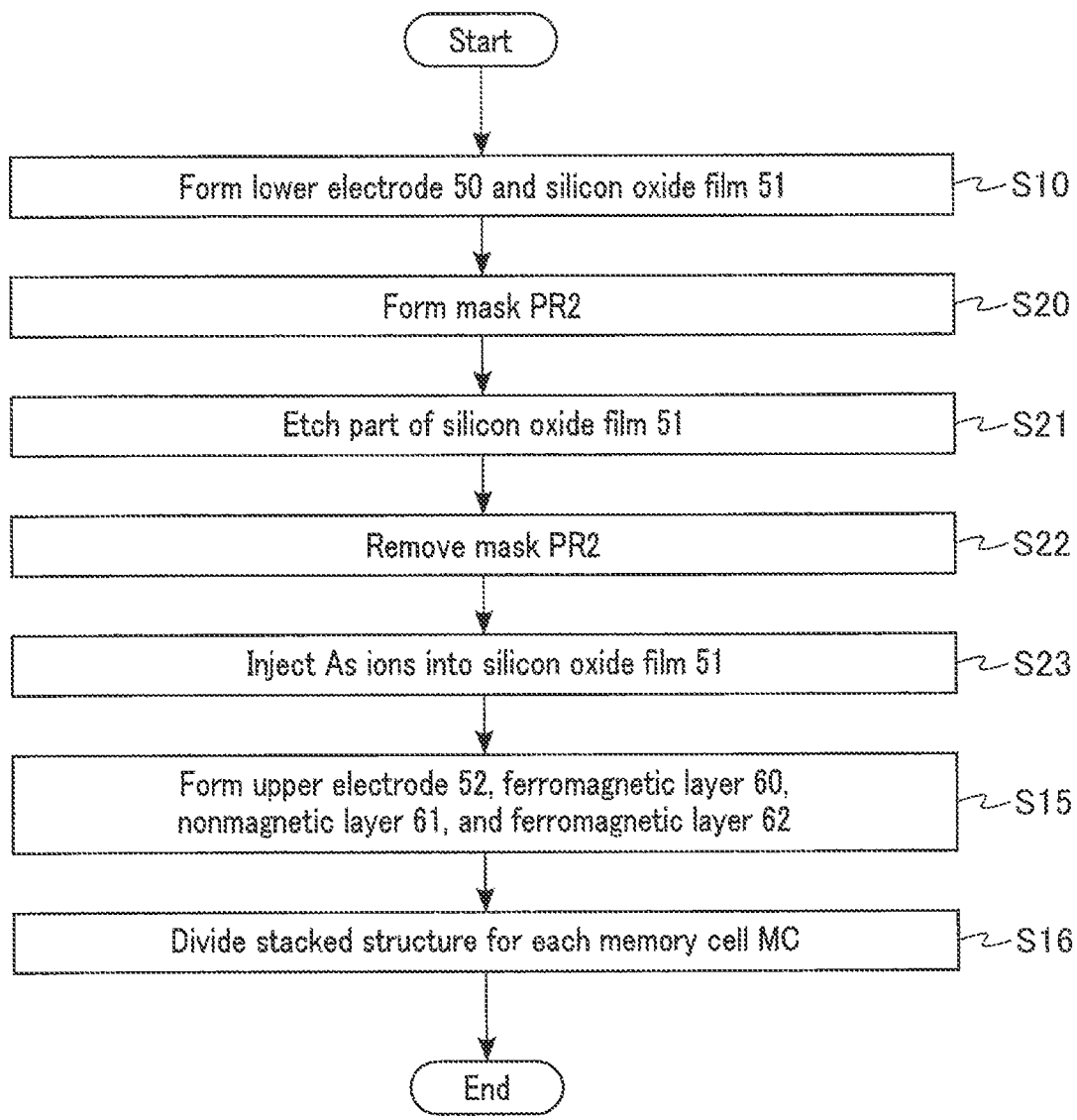
FIG. 23 is a flowchart showing an example of a method of manufacturing the memory device according to the second embodiment.

FIG. 23 is a flowchart showing an example of a method of manufacturing the memory device 20 according to the second embodiment. Each of FIGS. 24 to 28 is a cross-sectional view showing an example of the cross-sectional structure in the course of manufacturing the memory device 20 according to the second embodiment, and showing a cross section including the first storage region RG1 and the second storage region RG2. By referring to FIG. 23 as necessary, an example of a method of forming the selectors SELa and SELb and the MTJ element according to the second embodiment will be described below.

First, the lower electrode 50 and the silicon oxide film 51 are formed in a manner similar to the first embodiment (step S10).

Figure 24:
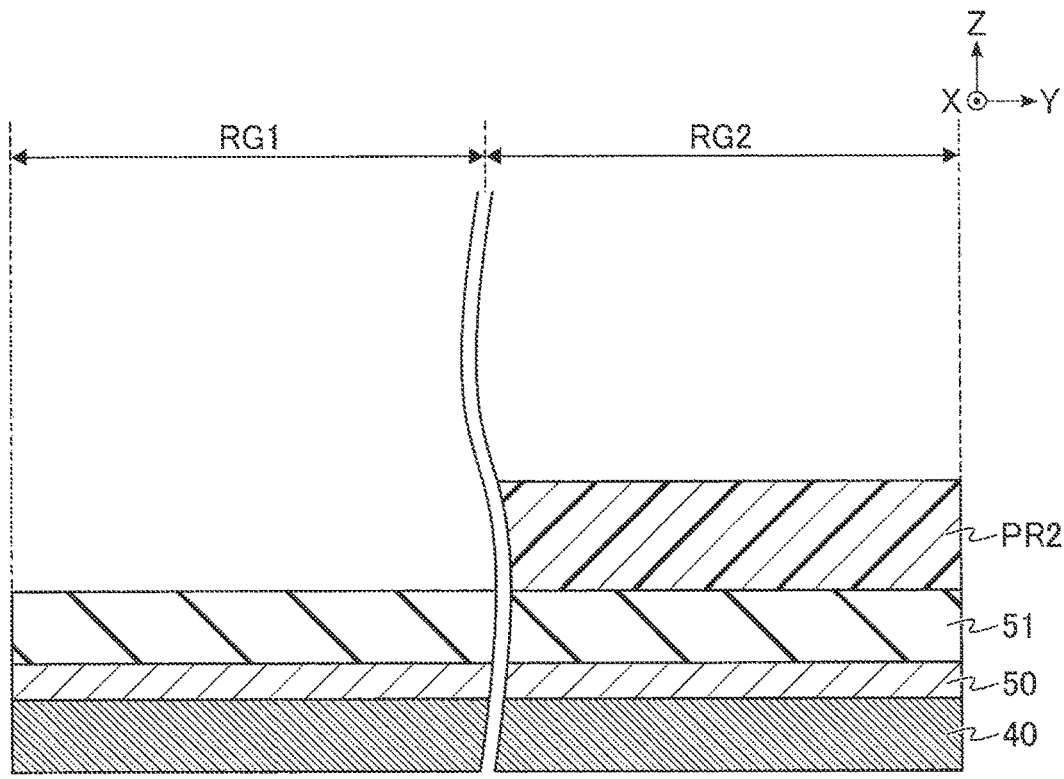

Next, a mask PR2 is formed, as shown in FIG. 24 (step S20). For example, photolithography is utilized to form the mask PR2. The mask PR2 covers a portion corresponding to the second storage region RG2. On the other hand, a portion of the mask PR2 corresponding to the first storage region RG1 is opened. Namely, in the first storage region RG1, the surface of the silicon oxide film 51 is exposed.

Figure 25:
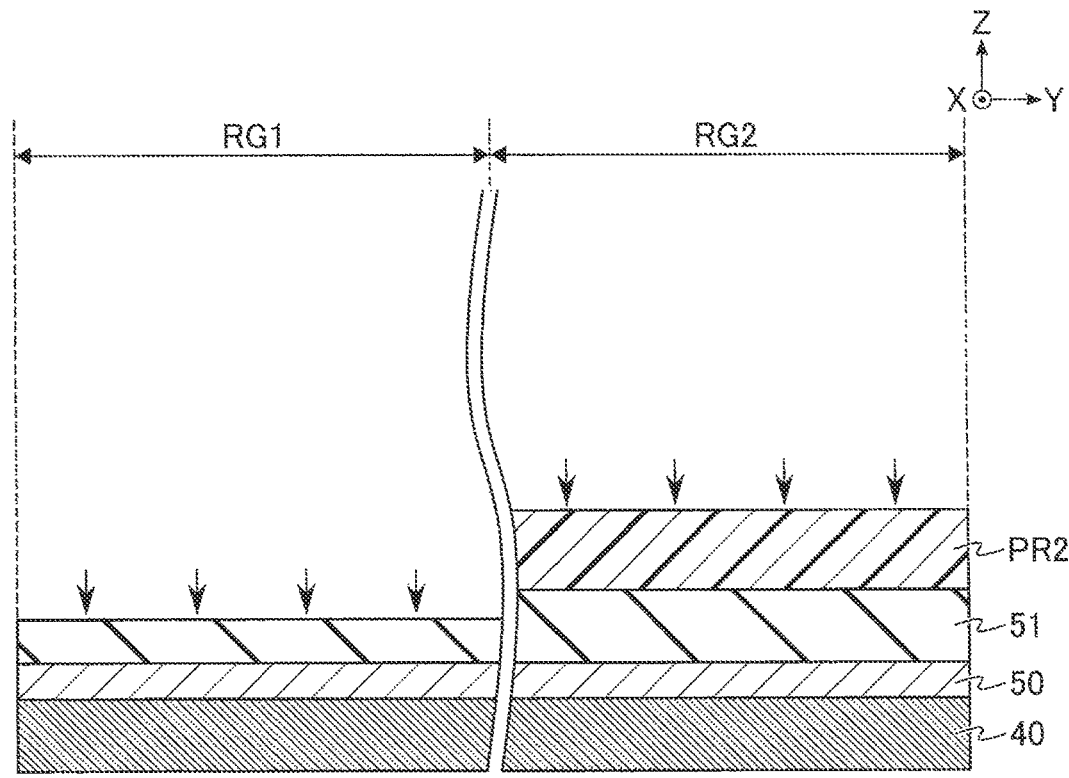

Next, a part of the silicon oxide film 51 is etched, as shown in FIG. 25 (step S21). Specifically, etching processing using the mask PR2 is performed to etch the silicon oxide film 51 exposed at the opening of the mask PR2 (the first storage region RG1), and a portion of the silicon oxide film 51 covered with the mask PR2 (the second storage region RG2) is protected by the mask PR2. Then, the film thickness of the silicon oxide film 51 in the first storage region RG1 becomes smaller than the film thickness of the silicon oxide film 51 in the second storage region RG2. The film thickness of the silicon oxide film 51 in the first storage region RG1 corresponds to FT3, and the film thickness of the silicon oxide film 51 in the second storage region RG2 corresponds to FT2.

Next, the mask PR2 is removed (step S22).

Next, As ions are injected into the silicon oxide film 51, as shown in FIG. 26 (step S23). Specifically, ion injection processing using As ions is performed in a state where the mask PR2 is removed, so that the silicon oxide film 51 in the first storage region RG1 and the silicon oxide film 51 in the second storage region RG2 are doped with arsenic. In this ion injection processing, the first storage region RG1 and the second storage region RG2 are doped with arsenic in single processing; however, there will be a difference between the As concentration in the first storage region RG1 and that in the second storage region RG2 depending on the film thickness of the silicon oxide film 51. In this example, since the film thickness of the silicon oxide film 51 in the first storage region RG1 is smaller than that of the silicon oxide film 51 in the second storage region RG2, the silicon oxide film 51 in the first storage region RG1 has higher As concentration than that of the silicon oxide film 51 in the second storage region RG2. Thus, the silicon oxide film 51c is formed in the first storage region RG1, and the silicon oxide film 51b is formed in the second storage region RG2.

Next, in a manner similar to the first embodiment, the ferromagnetic layer 60, the nonmagnetic layer 61, and the ferromagnetic layer 62 are formed, as shown in FIG. 27 (step S15). In the second embodiment, the film thickness differs between the silicon oxide film 51c in the first storage region RG1 and the silicon oxide film 51b in the second storage region RG2; thus, a step may be formed between the first storage region RG1 and the second storage region RG2.

Figure 28:
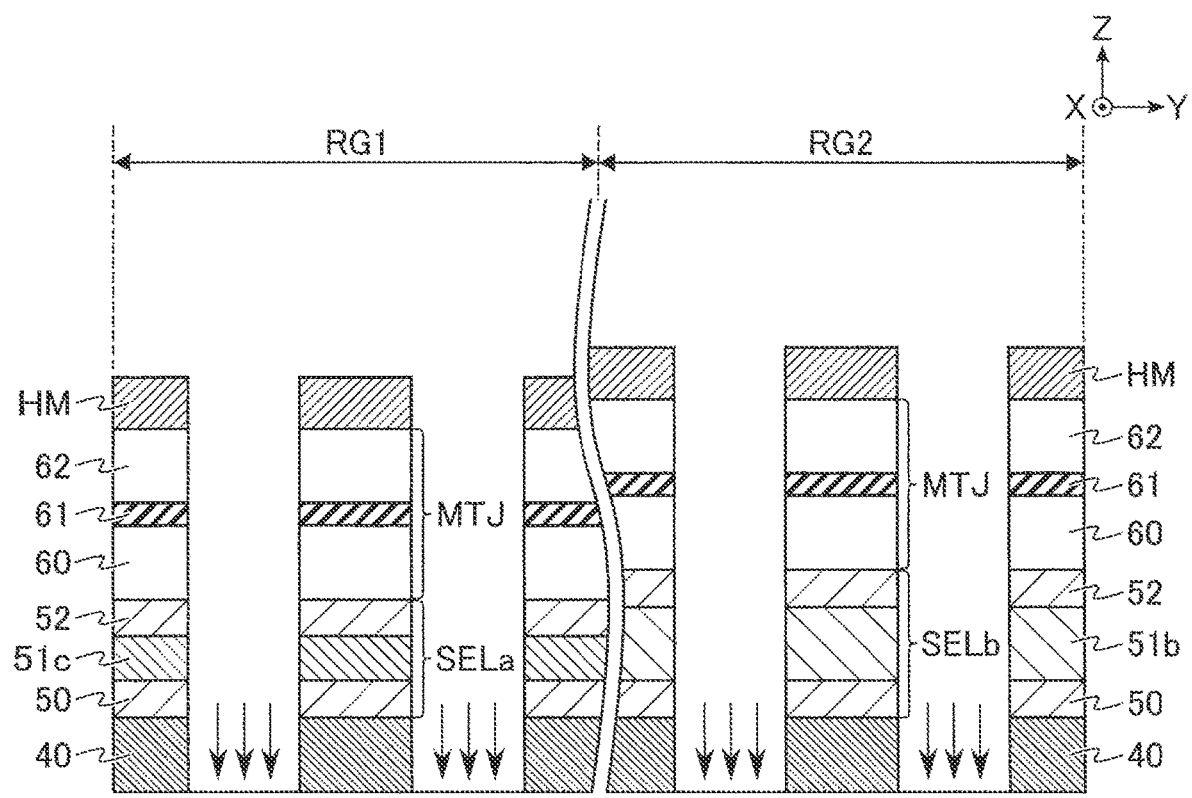

Next, in a manner similar to the first embodiment, the stacked structure is divided for each memory cell MC, as shown in FIG. 28 (step S16). Specifically, through the etching processing using the hard mask HM, etc., each of the ferromagnetic layer 62, the nonmagnetic layer 61, the ferromagnetic layer 60, the upper electrode 52, the silicon oxide films 51c and 51b, the lower electrode 50 is divided for each memory cell MC. The memory cell MC formed in the first storage region RG1 corresponds to the memory cell MCa including the selector SELa that uses the silicon oxide film 51c. The memory cell formed in the second storage region RG2 corresponds to the memory cell MCb including the selector SELb using the silicon oxide film 51b.

Through the manufacturing process described above, the selectors SELa and SELb, and the memory cells MC according to the second embodiment are formed. Impurities added to the silicon oxide films 51c and 51b are activated by performing thermal processing after the ion injection processing. The timing at which impurities added to the silicon oxide films 51c and 51b may be set appropriately. Different processing acts may be added between the respective processing described above, and the number and the type of layers formed in the processing of step S10 and step S15 may be increased based on the structures of the selector SEL and variable resistance element MTJ. The hard mask HM may be removed, and the local bit line LBL may be coupled to the top of the hard mask HM.

[2-3] Advantageous Effects of Second Embodiment

The memory system 1 according to the second embodiment described above can achieve both the performance and the storage capacity and maximize the chip performance, as in the case of the first embodiment. Namely, the memory system 1 according to the second embodiment can enhance the performance of the memory device 20, as in the case of the first embodiment.

[3] Others

In the manufacturing process of the memory device 20 according to the second embodiment, the number of times the ion injection processing is performed is low and the etching step is added, as compared with the manufacturing process of the memory device 20 according to the first embodiment. Therefore, the user can utilize an optimal manufacturing process according to the equipment in the factory by selecting either the first embodiment or the second embodiment according to the capacity of the manufacturing apparatus.

The structures of the memory cells MC described in the above embodiments are merely examples. For example, the memory cells MC may include other conductors. For example, a conductor may be interposed between the selector SEL and the source line SL, or between the variable resistance element MTJ and the bit line BL, or between the selector SEL and the variable resistance element MTJ. The areas, arrangement, etc., of the first storage region RG1 and the second storage region RG2 can be changed appropriately. The memory device 20 may include three or more storage regions RG having memory matrices MAT of different sizes. The sizes of the memory matrices MAT, sub-arrays SA and the like may be compared, for example, according to the area of the cross-point structure including multiple memory cells MC. The sizes of the memory cells MCa and MCb may differ from each other. It suffices that at least the selectors SEL having different threshold voltages are used for each storage region RG.

In the above embodiment, the case where MRAM adopting a magnetoresistance effect element is used as the memory device 20 is described as an example; however, the configuration is not limited thereto. Each of the embodiments may be applied to other variable resistance memories such as a resistance random access memory (ReRAM), a phase change memory (PCM), an interfacial phase change memory (iPCM), and a phase-change RAM (PRAM). The memory cells MC may store two-or-more bit data depending on the type of the variable resistance element used in the memory cells MC. In such a case, there will be at least three resistance states that the variable resistance element included in the memory cells MC may take. In addition, the above embodiment may be applied to the selector SEL used in the memory cell array having a cross-point structure, regardless of whether the memory is volatile or non-volatile.

In the above embodiment, the application of a voltage to the source line SL (local source line LSL) corresponds to application of a voltage supplied by the driver circuit 24 to the read circuit 32, or the write circuit 33, to the local source line LSL via the global source line GSL and the row selection circuit RSC. The application of a voltage to the bit line BL (local bit line LBL) corresponds to application of a voltage supplied by the driver circuit 24 to the read circuit 32, or the write circuit 33, to the local bit line LBL via the global bit line GBL and the column selection circuit CSC. The application of a ground voltage corresponds to, for example, the grounding of an interconnect to which the ground voltage is applied via the sink circuit 31.

Herein, the "arsenic (As) concentration of the selector SEL" refers to the AS concentration of the silicon oxide film 51. The distribution of the As concentration in the silicon oxide film 51 can be measured by, for example, secondary ion mass spectrometry (SIMS). A measurement value of Ihalf can be obtained by, for example, measuring a current leaking from another address (local bit line LBL) in the state where a voltage has been applied to one local bit line LBL selected. The write endurance of the memory cell MC is evaluated based on the number of times the data in the evaluation target memory cell MC is rewritten.

Herein, the term "couple" refers to electrical coupling, and does not exclude interposition of another component. The "sub-array" may be referred to as a "memory area" or as a "memory cell array". The "first storage region RG1" and the "second storage region RG2" may be referred to as a "first memory cell array" and a "second memory cell array", respectively.

Herein, the "region" may be regarded as a component included in a semiconductor substrate on which the memory device 20 is formed. For example, when it is specified that the semiconductor substrate includes the first storage region RG1 and the second storage region RG2, the first storage region RG1 and the second storage region RG2 are associated with different regions above the semiconductor substrate, respectively. The "height" corresponds to, for example, the distance in the Z direction between the measurement target component and the semiconductor substrate. A component other than the semiconductor substrate may be used as a reference of the "height". The "height of the memory cell MC" corresponds to, for example, the length of the bottom surface of the selector SEL and the top surface of the variable resistance element MTJ in the Z direction. When the heights of the memory cells MC are compared with each other, the heights of the memory cells MC may be compared based on the portion including at least the silicon oxide film 51 and the variable resistance element MTJ of the selector SEL. The "thickness" and the "film thickness" correspond to the thickness of the target components along the Z direction. The sizes of the variable resistance elements MTJ may be compared according to the area of the surface parallel to the substrate, or may be compared according to the volume. The "interconnect lengths" are compared, for example, based on the conductor used in the portion provided to the cross-point structure in the memory cell array 30.

While certain embodiments have been described, these embodiments have been presented by way of example only, and are not intended to limit the scope of the inventions. These novel embodiments can be implemented in various other forms, and various omissions, replacements, and changes can be made without departing from the spirit of the invention. The embodiments and their modifications are covered by the accompanying claims and their equivalents, as would fall within the scope and gist of the inventions.

The invention claimed is:

1. A memory device comprising:
   a memory cell array including a plurality of first sub-arrays and a plurality of second sub-arrays;
   a plurality of first memory cells included in each of the plurality of first sub-arrays;
   a plurality of second memory cells included in each of the plurality of second sub-arrays;
   a first read circuit for reading data of the plurality of first memory cells;
   a second read circuit for reading data of the plurality of second memory cells, the second read circuit differing from the first read circuit;
   a first write circuit for writing data to the plurality of first memory cells; and
   a second write circuit for writing data to the plurality of second memory cells, the second write circuit differing from the first write circuit,
   wherein an area of the first sub-array is different from an area of the second sub-array, and
   wherein a storage capacity of the second sub-array is larger than a storage capacity of the first sub-array.

2. The device of claim 1, wherein:
   each of the plurality of first sub-arrays further includes a plurality of first bit lines and a plurality of first source lines,
   each of the plurality of first memory cells includes a first variable resistance element and a first switching element which are coupled between a single first bit line and a single first source line, and coupled in series between the single first bit line and the single first source line, each of the plurality of second sub-arrays further includes a plurality of second bit lines and a plurality of second source lines, each of the plurality of second memory cells includes a second variable resistance element and a second switching element which are coupled between a single second bit line and a single second source line, and coupled in series between the single second bit line and the single second source line, and a threshold voltage of the first switching element is different from a threshold voltage of the second switching element.

3. The device of claim 2, wherein:
the area of the first sub-array is smaller than the area of the second sub-array, and
a threshold voltage of the first switching element is lower than a threshold voltage of the second switching element.

4. The device of claim 3, wherein:
the first switching element includes a first silicon oxide film which includes arsenic and is electrically coupled between the single first bit line and the single first source line,
the second switching element includes a second silicon oxide film which includes arsenic and is electrically coupled between the single second bit line and the single second source line, and
a concentration of arsenic included in the first silicon oxide film is different from a concentration of arsenic included in the second silicon oxide film.

5. The device of claim 4, wherein:
a concentration of arsenic included in the first silicon oxide film is at least 30 at %, and
a concentration of arsenic included in the second silicon oxide film is at most 10 at %.

6. The device of claim 4, wherein a film thickness of the first silicon oxide film is equal to a film thickness of the second silicon oxide film.

7. The device of claim 4, wherein a film thickness of the first silicon oxide film is smaller than a film thickness of the second silicon oxide film.

8. The device of claim 7, wherein a height of the first memory cell in a first direction is lower than a height of the second memory cell in the first direction.

9. The device of claim 2, wherein a size of the first variable resistance element is equal to a size of the second variable resistance element.

10. The device of claim 2, wherein each of the first variable resistance element and the second variable resistance element comprises a magnetic variable resistance element including a first ferromagnetic layer, a nonmagnetic layer above the first ferromagnetic layer, and a second ferromagnetic layer above the nonmagnetic layer.

11. The device of claim 2, wherein:
an interconnect length of the first bit line is shorter than an interconnect length of the second bit line, and
a number of the first memory cells coupled to the first bit line is smaller than a number of the second memory cells coupled to the second bit line.

12. The device of claim 2, further comprising:
a plurality of first global bit lines coupled to the plurality of first sub-arrays;
a plurality of first global source lines coupled to the plurality of first sub-arrays;
a plurality of second global bit lines coupled to the plurality of second sub-arrays; and
a plurality of second global source lines coupled to the plurality of second sub-arrays;
wherein:
each of the plurality of first sub-arrays is associated with a single first global bit line and a single first global source line, and further includes a first column selection circuit and a first row selection circuit, the first column selection circuit being configured to be selectively coupled between the single first global bit line and the plurality of first bit lines, and the first row selection circuit being configured to be selectively coupled between the single first global source line and the plurality of first source lines, and
each of the plurality of second sub-arrays is associated with a single second global bit line and a single second global source line, and further includes a second column selection circuit and a second row selection circuit, the second column selection circuit being configured to be selectively coupled between the single second global bit line and the plurality of second bit lines, and the second row selection circuit being configured to be selectively coupled between the single second global source line and the plurality of second source lines.

13. The device of claim 1, wherein:
the plurality of first sub-arrays and the plurality of second sub-arrays are formed on a same substrate, and
an area of the plurality of second sub-arrays is larger than an area of the plurality of first sub-arrays.

14. The device of claim 1, wherein a write endurance of the first memory cell is higher than a write endurance of the second memory cell.

15. A memory system, comprising:
the memory device according to claim 1; and
a memory controller configured to control the memory device,
wherein the memory controller is configured to:
order the memory device to write first data to one of the plurality of first sub-arrays when the memory controller is ordered to write the first data, the first data being data indicated as having a first frequency of access from an external host device; and
order the memory device to write second data to one of the plurality of second sub-arrays when the memory controller is ordered to write the second data, the second data being data indicated as having a second frequency of access from an external host device, and the second frequency of access being lower than the first frequency of access.

16. A method of manufacturing a memory device, the method comprising:
forming a silicon oxide film in a first region and a second region;
injecting arsenic into the silicon oxide film;
forming a mask on the silicon oxide film injected with arsenic, the mask covering the second region, and a portion of the mask corresponding to the first region being opened;
injecting arsenic into the silicon oxide film in the first region using the mask; and
removing the mask after injecting arsenic into the silicon oxide film in the first region, and dividing the silicon oxide film for each of at least one memory cell.

17. The method of claim 16, further comprising:
forming a first ferromagnetic layer, a nonmagnetic layer, and a second ferromagnetic layer above the silicon oxide film in this order after removing the mask, wherein a set including the first ferromagnetic layer, the nonmagnetic layer, and the second ferromagnetic layer functions as part of the at least one memory cell.

18. A method of manufacturing a memory device, the method comprising:
   forming a silicon oxide film in a first region and a second region;
   forming a mask on the silicon oxide film, the mask covering the second region, and a portion of the mask corresponding to the first region being opened;
   etching at least a part of the silicon oxide film in the first region using the mask;
   removing the mask after the etching;
   injecting arsenic into the silicon oxide film after removing the mask; and
   dividing the silicon oxide film for each of at least one memory cell after injecting arsenic into the silicon oxide film.

19. The method of claim 18, further comprising:
   forming a first ferromagnetic layer, a nonmagnetic layer, and a second ferromagnetic layer above the silicon oxide film in this order after injecting arsenic into the silicon oxide film,
   wherein a set including the first ferromagnetic layer, the nonmagnetic layer, and the second ferromagnetic layer functions as part of the at least one memory cell.

* * * * *